US008664970B2

(12) United States Patent
Levermore et al.

(10) Patent No.: US 8,664,970 B2
(45) Date of Patent: Mar. 4, 2014

(54) METHOD FOR ACCELERATED LIFETESTING OF LARGE AREA OLED LIGHTING PANELS

(75) Inventors: Peter Levermore, Lambertville, NJ (US); Huiqing Pang, Newtown, PA (US); Lech Michalski, Pennington, NJ (US); Mike Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 371 days.

(21) Appl. No.: 13/047,221

(22) Filed: Mar. 14, 2011

(65) Prior Publication Data

US 2012/0235701 A1   Sep. 20, 2012

(51) Int. Cl.
*G01R 31/26* (2006.01)

(52) U.S. Cl.
USPC .................. 324/762.01; 257/40; 313/506

(58) Field of Classification Search
None
See application file for complete search history.

(56) References Cited

U.S. PATENT DOCUMENTS

| | | | |
|---|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 7,279,704 B2 | 10/2007 | Walters et al. |
| 7,431,968 B1 | 10/2008 | Shtein et al. |
| 2003/0230980 A1 | 12/2003 | Forrest et al. |
| 2004/0174116 A1 | 9/2004 | Lu et al. |

OTHER PUBLICATIONS

Levermore, P.A. et al., Development of Phosphorescent OLED Lighting Panels for Highly Efficient Solid State Lighting, Feb. 11, 2008, Proc. of SPIE vol. 7617 761704-1 pp. 1-5.*
Energy Star Manufacturer's Guide for Qualifying Solid State lighting Luminaires, Sep. 2008, U.S. D.O.E.*
Baldo et al., "Highly Efficient Phosphorescent Emission from Organic Electroluminescent Devices," Nature, vol. 395, 151-154, (1998).

(Continued)

*Primary Examiner* — Melissa Koval
*Assistant Examiner* — Stephen G Armstrong
(74) *Attorney, Agent, or Firm* — Sterne, Kessler, Goldstein & Fox P.L.L.C.

(57) ABSTRACT

A method for accelerated life testing of organic devices is provided. The lifetime of each of one or more individual organic emissive devices is measured at a non-heating current density. Based upon the measured lifetimes of the one or more devices, the device lifetime is determined for a selected luminance. An organic emissive panel is also obtained having a second organic stack that consists essentially of the one or more organic layers of the first organic stack. The junction temperature of the organic emissive panel is then determined at a heating current density. Based upon the junction temperature and the device lifetime of the one or more individual organic emissive devices, the expected lifetime of the organic emissive panel is then determined at the heating current density.

18 Claims, 15 Drawing Sheets

(56) References Cited

OTHER PUBLICATIONS

Baldo et al., "Very high-efficiency green organic light-emitting devices based on electrophosphorescence," Appl. Phys. Lett., vol. 75, No. 3, 4-6 (1999).

Levermore et al., Phosphorescent OLEDs: Lighting the Way for Energy-Efficient Solid-State Light Sources, Information Display 10/10 (2010).

Lu et al., OLED Requirements for Solid-State Lighting, Information Display (Oct. 2010).

Tessler et al., Current Heating in Polymer Light Emitting Diodes, Applied Physics Letters, vol. 73:6 (Aug. 10, 1998).

Zhou et al., Real-Time Observation of Temperature Rise and Thermal Breakdown Processes in Organic LEDs Using an IR Imaging and Analysis System, Advanced Materials, vol. 12:4 (2000).

Tsai et al., "Easy Process and Performance Improvement for Top-Emission Organic Light-Emitting Diodes by Using UV Glue as the Insulation Layer on Copper Substrate", Journal of Display Technology, vol. 6, No. 7, Jul. 2010.

Levermore et al.,"Highly Efficient Phosphorescent OLED Lighting Panels for Solid State Lighting", SID Symposium Digest of Technical Papers—May 2010—vol. 41, Issue 1, pp. 786-789.

\* cited by examiner

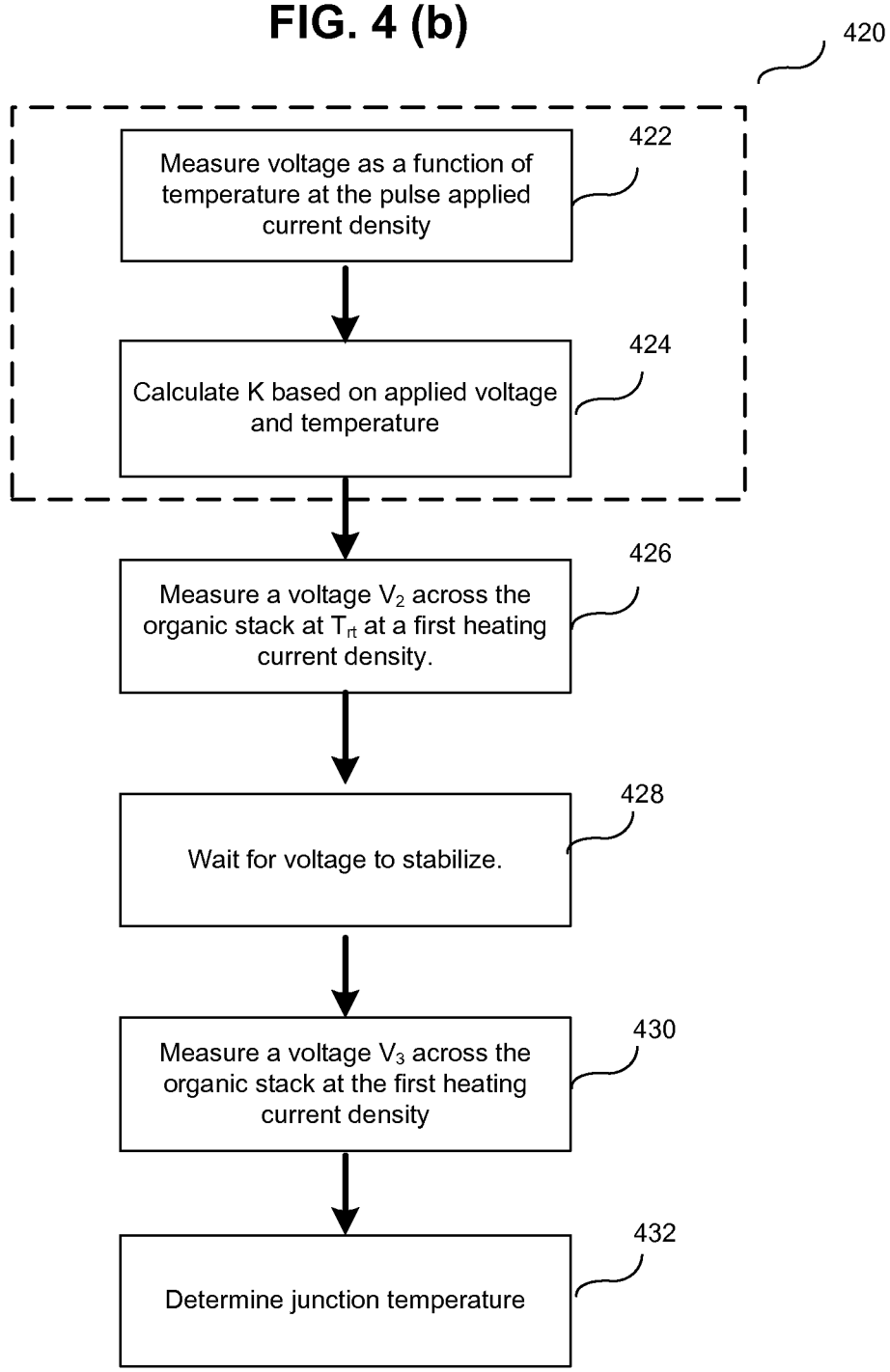

METHOD FOR ACCELERATED LIFETESTING OF LARGE AREA OLED LIGHTING PANELS

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the structure of Formula I:

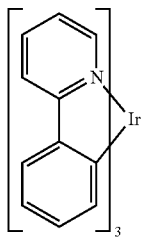

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

BRIEF SUMMARY OF THE INVENTION

A method for accelerated life testing of organic devices, and in particular large area organic emissive devices, is provided. The first method comprises obtaining one or more individual organic emissive devices, each having a first organic stack comprising one or more organic layers. The lifetime of each of the one or more individual organic emissive devices is measured at one or more temperatures at a non-heating current density. Preferably, the one or more temperatures correspond to the ambient temperature of the devices. Preferably the ambient temperature may be controlled by using a thermally controlled environment. Based upon the measured lifetimes at the non-heating current density of the one or more devices, the device lifetime is determined for a selected luminance. An organic emissive panel is also obtained having a second organic stack that consists essentially of the one or more organic layers of the first organic stack. The junction temperature of the organic emissive panel is then determined at a heating current density. Based upon the junction temperature and the device lifetime of the one or more individual organic emissive devices at the selected luminance, the expected lifetime of the organic emissive panel is then determined at the heating current density.

In some embodiments, obtaining one or more individual organic emissive devices and/or obtaining the organic emissive panel may comprise fabricating the organic emissive devices and/or panel. In some embodiments, the individual organic emissive devices and the organic emissive panel may be purchased or otherwise acquired from a third party, or portions of the organic emissive devices and/or organic emissive panel may be purchased or acquired and then combined with other elements or components.

In some embodiments, following the completion of methods described herein for determining the lifetime and related characteristics of the organic emissive panel, a comparison of the determined lifetime with the expected operation of the device may be performed to determine whether an organic emissive panel is suitable for its intended use. If the panel is suitable, then it is operated at the selected luminance.

In some embodiments, in the first method described above, the step of measuring the lifetime of each of the one or more individual organic emissive devices includes measuring the lifetime of a plurality of the individual organic emissive devices at a range of ambient temperatures. A relationship between device lifetime and ambient temperature is then determined for the selected luminance. The expected lifetime of the organic emissive panel is then determined based upon the junction temperature and the relationship between device lifetime and ambient temperature of the plurality of individual organic emissive devices.

In some embodiments, in the first method described above, the step of measuring the lifetime of each of the one or more individual organic emissive devices includes measuring the lifetime of each of the one or more individual organic emissive devices at an ambient temperature that is approximately equal to the junction temperature of the organic emissive panel. The device lifetime of the individual organic emissive devices may be determined at the selected luminance by performing an accelerated lifetime test, which comprises measuring the lifetime of a plurality of the individual organic emissive devices at a range of current densities. In some embodiments, the step of determining the lifetime of the organic emissive device may include measuring the lifetime of at least one of the individual organic emissive devices at an ambient temperature that is approximately equal to the junction temperature of the panel operating at the selected luminance.

In some embodiments, the organic emissive panel may include at least three different types of organic stacks. The lifetime of at least one of the different stacks may be measured using any of the methods described above. The organic emissive panel may also comprise a lighting panel or a display panel. In the first method described above, the measuring of the lifetime of each of the plurality of individual organic emissive devices may be performed by an accelerated lifetime test.

In some embodiments, the step of determining the junction temperature of the organic emissive panel in the first method described above further comprises the steps of determining a relationship K between applied voltage and ambient temperature for the panel at a first non-heating current density. The method further comprises measuring a first voltage $V_1$ across the organic stack at a first temperature $T_{rt}$ of the panel at a second non-heating current density. The panel is energized to approximately the selected luminance such that a second temperature higher than the first temperature is reached. A second voltage $V_4$ is measured across the organic stack at a second temperature of the panel at the second non-heating current density. The junction temperature $T_j$ of the panel is determined as:

$$T_j = T_{rt} + K(V_1 - V_4).$$

Additionally, in embodiments where the step of determining the relationship K in the method described above uses a first non-heating current density, the steps for determining the relationship K may further comprise measuring the voltage across the organic stack in the organic emissive panel as a function of ambient temperature at the first non-heating current density. The relationship K between applied voltage and ambient temperature for the panel may then be calculated as the gradient of an approximate linear fit of the measured voltage versus ambient temperature. In some embodiments, the first non-heating current density and the second non-heating current density may be the same. In some embodiments, the first non-heating current density is not more than about 1 mA/cm$^2$ and/or the second non-heating current density is not more than about 1 mA/cm$^2$.

In some embodiments, the step of determining the junction temperature of the organic emissive panel in the first method described above further comprises determining a relationship K between applied voltage and ambient temperature for the panel at a pulse applied current density. The pulse applied current density has a pulse width, a separation between pulses, a duty cycle, an average current density, wherein the average current density is a non-heating current density, and a peak current density. The method further comprises measuring a first voltage $V_2$ across the organic stack at a first temperature $T_{rt}$ of the panel at a first heating current density. A second voltage $V_3$ is measured across the organic stack at a second temperature of the panel at the first heating current density. The junction temperature $T_j$ of the panel is determined as:

$$T_j = T_{rt} + K(V_2 - V_3).$$

Additionally, in some embodiments where the step of determining the relationship K in the method described above uses a pulse applied current density, the steps for determining the relationship K may further comprise measuring the voltage across the organic stack in the organic emissive panel as a function of ambient temperature at the pulse applied current density. The relationship K between applied voltage and ambient temperature for the panel may be calculated as the gradient of an approximate linear fit of the measured voltage versus ambient temperature.

Preferably, the peak current density of the pulse applied current density is the same as the current density that energizes the panel to approximately the selected luminance. Preferably, the pulse width of the pulse applied current density is less than 20 ms. More preferably, the pulse width of the pulse applied current density is less than 10 ms. Preferably, the pulse duty cycle is less than 25%. More preferable, the pulse duty cycle is less than 10%. Preferably, the peak current density is at least 5 mA/cm$^2$. The peak current density may also be at least 10 mA/cm$^2$.

In some embodiments, the step of determining the junction temperature of the organic emissive panel in the first method described above further comprises the steps of measuring a surface temperature of the organic emissive panel. Preferably, the temperature is measured at a plurality of points on a surface of the organic emissive panel. The surface temperature may be determined by taking a weighted average of the measured temperatures at the plurality of points. In some embodiments, each of the plurality of points where the temperature is measured on the surface of the organic emissive panel is located substantially above an emissive region.

In some embodiments of the first method described above, each of the individual organic emissive devices has a surface area of not more than about 1 cm$^2$. Further, each of the individual organic emissive devices may have a surface area of not more than about 2 mm$^2$. Each of the plurality of individual organic emissive devices may also comprise a separate pixel. In some embodiments, the organic emissive panel has a surface area of at least about 1000 mm$^2$.

In some embodiments, the first method may further comprise the steps of determining that the organic emissive panel has an expected lifetime above a threshold lifetime value, a junction temperature below a threshold temperature, or both, and then selecting the organic emissive panel for use from among a plurality of organic emissive panels.

In some embodiments, the first method further comprises the steps of determining the expected lifetime for a plurality of organic emissive panels and selecting at least one of the plurality of organic emissive panels based upon (1) the expected lifetime of the at least one organic emissive panel, (2) the junction temperature of the at least one organic emissive panel, or both. Each of the plurality of organic emissive panels may comprise the same organic stack structure. In some embodiments, the selected organic emissive panel may have a junction temperature of not more than about 40 degrees Celsius. The method may further comprise constructing an organic light-emitting device apparatus using the selected at least one organic emissive panel. The organic light-emitting apparatus may be a general purpose light fixture or a display.

Embodiments disclosed herein provide methods that may be used for determining the lifetimes of large area organic emissive panels. Embodiments may include the steps of determining the lifetime of a small area individual organic emissive device at an ambient temperature that is approximately equal to the junction temperature at which an equivalent large area organic emissive panel operates when energized to a selected luminance. The lifetime determination for the small area device may then be utilized to approximate the lifetime of the large area organic emissive panel at a selected luminance level (such as the operating luminance level) and the corresponding junction temperature of the panel. For instance, methods may include measuring the lifetime of one or more equivalent small area individual organic emissive device at a range of ambient temperatures, and then determining the relationship between ambient temperature and lifetime for a given organic stack. A large area organic emissive panel is then obtained having an organic stack that is equivalent to the organic stack of the small area individual organic emissive device. Generally, the stack need only be functionally or structurally equivalent, and does not need to be identical. The junction temperature of the panel is then measured at a selected luminance level, which may be done using any suitable method, including those described in detail below. The measured junction temperature for the large area organic emissive panel at the selected luminance is then used in conjunction with the lifetime data at the range of ambient temperatures measured for the small area individual organic emissive devices to estimate the lifetime for the equivalent device stack in the organic emissive panel layout.

DETAILED DESCRIPTION OF THE INVENTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
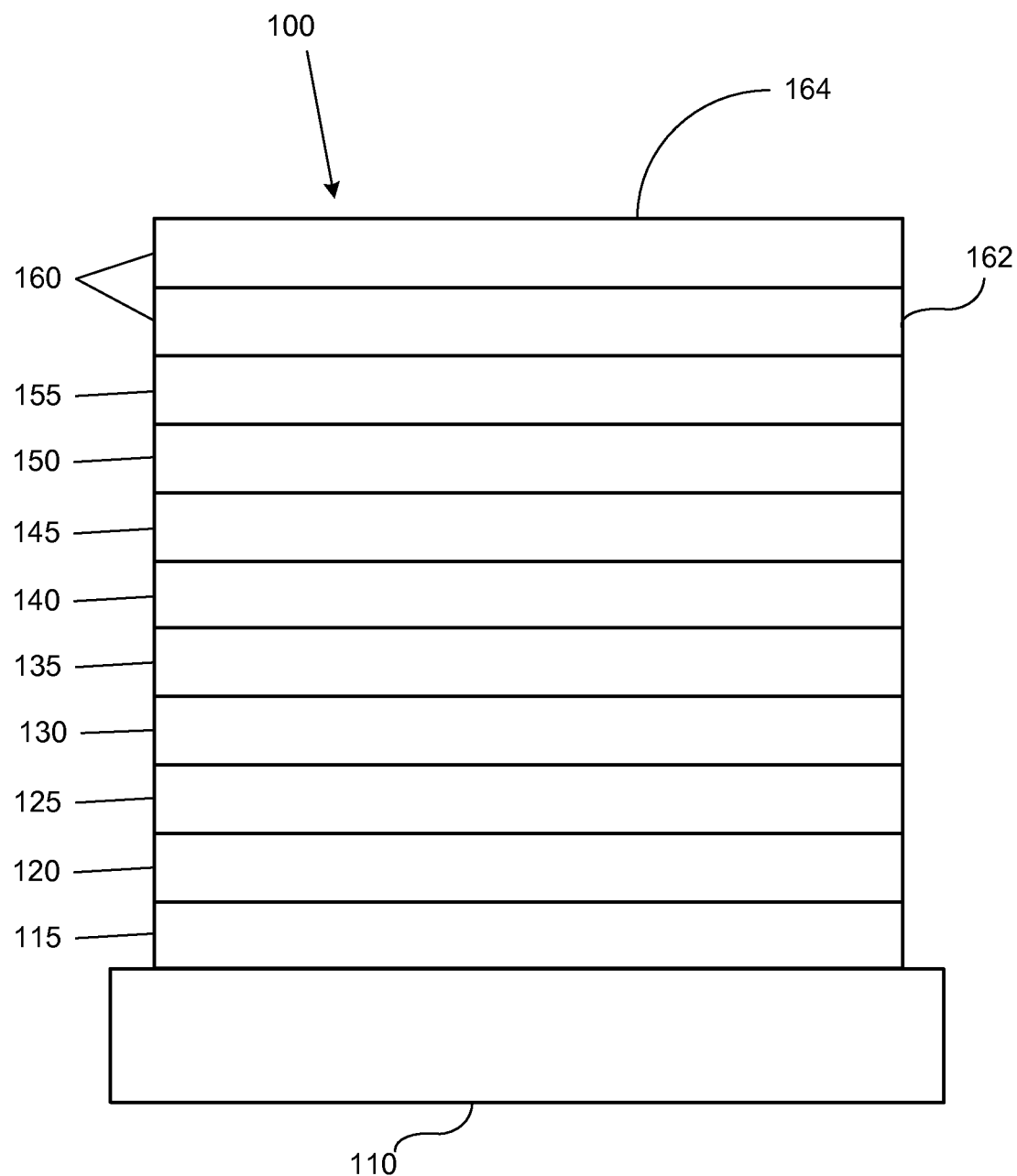
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279, 704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
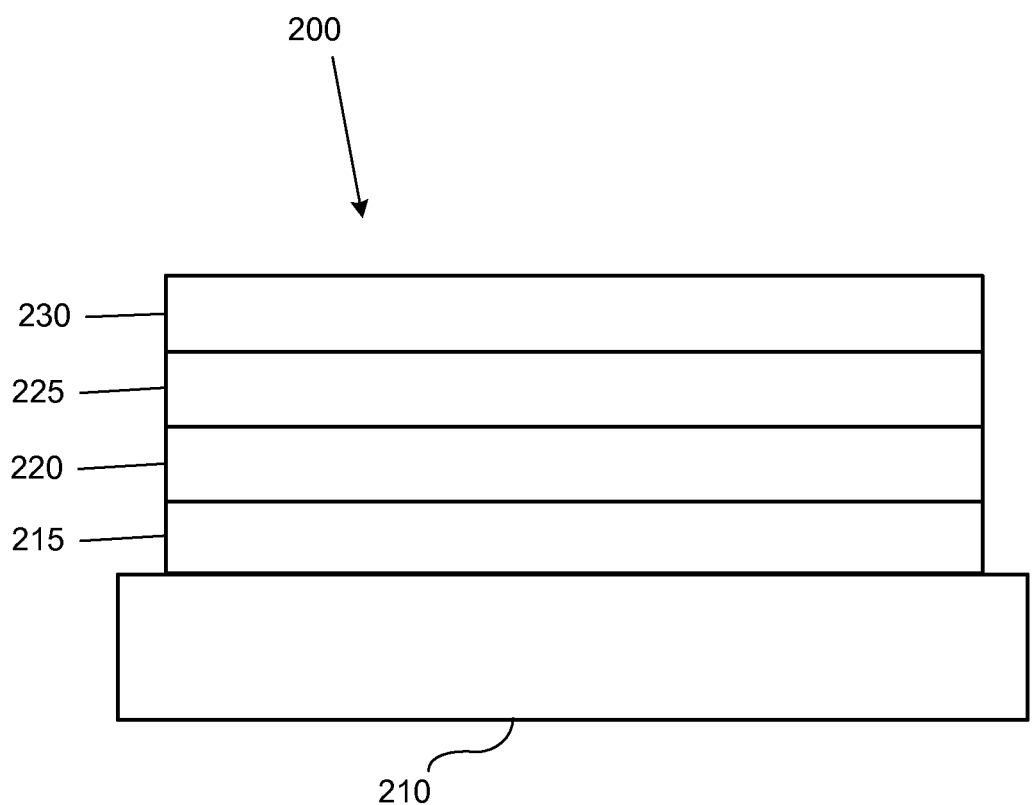
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, lighting fixtures, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Additional definitions for terms as used in this application are provided as follows:

As used herein, the term "junction temperature" refers to the highest temperature of the actual semiconductor in an electronic device. In operation, junction temperature is typically higher than the exterior temperature of the electronic device. For example, for an OLED light panel, junction temperature is typically higher than surface temperature. The difference between junction temperature and surface temperature is proportional to the product of the power dissipation and thermal resistance within the device. However, an additional correction is needed for aperture ratio. In an OLED light panel, junction temperature may be broadly defined as the temperature within the organic stack, and in particular, within the emissive layers (EMLs) or directly adjacent to the EMLs. This is the temperature that is required to accurately predict large area panel lifetime based on the degradation of the organic stack, which will be discussed in more detail below.

As used herein, the term "ambient temperature" is the temperature of an organic device in the absence of heating due to current density (or in some embodiments, the absence of material heating, which for some devices is heating that results in more than a 1° C. increase in junction temperature). In some embodiments, this may be the temperature of the surrounding environment (for instance, room temperature or the temperature in an oven). In some embodiments, the organic device could be placed onto a heating plate, and the temperature of the upper surface of the organic substrate (i.e. the surface of the substrate onto which the organics are disposed) could be used as the ambient temperature of the organic device or panel. This is preferred to taking the temperature directly from the heating plate, as there will most likely be an appreciable temperature drop across the substrate.

As used herein, the term "individual organic emissive device" refers to an organic device that is sufficiently separate from other devices such that when relatively high current densities are supplied to the device, the device continues to operate at approximately the ambient temperature. "Relatively high" current densities include current densities that may be significantly larger than a normal operating current density, for example as used to perform accelerated lifetime testing. The terms "pixel" and "small area organic device" may be used interchangeably with the term "individual organic emissive device." These organic devices typically have small surface areas relative to a substrate, so nearly all of the heat that is generated is typically easily dissipated.

As used herein, the term "organic emissive panel" refers to an organic device that, when operated at current densities that are approximately equal to the current density at a selected luminance (typically the level at which the device is to operate), the temperature of the device increases. That is, the junction temperature of the organic device is higher than the ambient temperature of the device. The heat that is generated from supplying high current densities typically cannot be easily dissipated. The term "panel" and "large area device" may be used interchangeably with the term "organic emissive panel."

As used herein, a first device is "equivalent" to a second device if (1) the organic stack of the first device consists essentially of the organic layers of the organic stack of the second device; (2) the organic stack of the first device is structurally equivalent to the organic stack of the second device; and/or (3) the organic stack of the first device is functionally equivalent to the organic stack of the second device.

As used herein, the organic stack of a first device "consists essentially of" the organic layers of the organic stack of a second device if the organic stack of the first device is expected to have a similar JV characteristic (where "J" is current density and "V" is voltage) and lifetime as the organic stack of the second device. That is, the organic stack of the first device will perform in the same way as the organic stack in the second device. By using this terminology, it is intended to encompass a situation where devices are not exactly identical, but the differences comprise, for instance, only a slight change to the thickness of a layer; a slight modification to a concentration of one of the layers; a material substitution with a material known to behave in the same way, and/or other small modifications such that a person of ordinary skill in the art would understand that the devices would function the same way for purposes of lifetime testing. These situations, and other differences that do not materially affect the characteristics and function of the device, are intended to be covered by this language.

As used herein, a first organic stack is "structurally equivalent" to a second organic stack if the first organic stack comprises materials that are the same as the second organic stack, and the thickness and concentrations levels of these materials (while not necessarily precisely identical) are within experimental error. For instance, the thickness and concentrations of each of the layers of the first organic stack may be within 10% of the corresponding layers in the second organic stack.

As used herein, a first organic stack is "functionally equivalent" to a second organic stack if the first organic stack comprises the same layers as the second organic stack, with only variations that do not significantly affect the JV characteristics or the lifetime of the organic stack. The variations may be in any form, by way of example, differences in thickness, concentrations, and/or material. If one of skill in the art believes that lifetime data from one device can reasonably be used to predict the lifetime of another device that is expected to have a similar lifetime, the devices are "functionally equivalent."

Accelerated Lifetesting

Accelerated lifetesting may be used to determine the lifetime of electronic devices such as semiconductor devices. With regards to small area individual organic emissive devices, accelerated lifetesting allows for lifetimes measured at higher luminance levels (which are typically shorter lifetimes) to be extrapolated to determine the lifetimes of devices operating at luminance levels that are used in applications (which are typically longer lifetimes). These methods are reliable for individual organic emissive devices because the heat that is produced when high current density is supplied to these devices during the accelerated lifetesting can generally be dissipated due, in part, to the devices' small surface area relative to the surface area of the substrate. The ability to dissipate this heat ensures a relatively accurate extrapolation from high to low current density using the simple relationship $t_2=t_1\times(L_1/L_2)^{Af}$, where Af is the acceleration factor (which is a factor that may be calculated as described in more detail below); $t_2$ is the extrapolated lifetime of the individual organic emissive device at an initial luminance level $L_2$; and $t_1$ is the measured lifetime at an initial luminance level $L_1$. Usually $L_2$ is less than $L_1$ and $t_2$ is greater than $t_1$ because the accelerated lifetesting is conducted at a higher current density than the operational current density, thereby energizing the device to a higher luminance level and congruently resulting in a shorter lifetime.

A method of accelerated lifetesting individual organic emissive devices can be described in more detail as follows: To determine the projected lifetime for an individual organic emissive device, a plurality of equivalent individual organic emissive devices are typically put onto a "lifetest" at a range of constant high current densities. For example, the devices may be tested using current densities of 10 mA/cm$^2$, 20 mA/cm$^2$ and 40 mA/cm$^2$. The lifetest comprises recording the initial luminance of the individual organic emissive devices (Lo) for each current density and then recording the luminance as a function of time as the OLED device degrades. The "lifetime" for each device is the time it takes for the device to degrade to a certain luminance level, which may be any desired value, but typically is dictated by the purpose of the organic device (such as the luminance level at which the device would need to be replaced or is no longer acceptable or ideal for a desired purpose). For instance, the lifetime of the individual organic emissive device may be the time it takes for the device to decay to 80% of the initial luminance level (e.g. LT80).

The lifetime of the individual organic emissive devices are recorded at each current density at an ambient temperature (e.g. at room temperature, the environmental temperature created in an oven, etc.). A plot of the lifetime of the individual organic emissive devices on a logarithmic scale [e.g. Log(LT80)] versus the initial luminance level of the device on a logarithmic scale [i.e. Log(Lo)] for each of the current densities may then be created. The gradient of the approximate linear fit of this plot gives the acceleration factor (Af) for the individual organic emissive devices, which can then be used to extrapolate the lifetime of the devices at lower luminance levels (i.e. lower current densities) at which the device may be operated in practical device applications. In this way, the lifetime of an individual organic emissive device may be determined for low current densities much faster than having to measure the actual lifetime of the device.

It should be noted that at very high current densities, even small area devices may begin to generate sufficient heat, which is not easily dissipated, such that there may no longer be a linear relationship between lifetime and initial luminance level. The current densities at which such heating occurs depends on the properties and characteristics of the individual devices. Current densities at which such heating occurs are referred to as "heating current densities," and current densities at which such heating does not occur are referred to as "non-heating current densities." A person of ordinary skill in the art would readily be able to determine such properties by applying current densities and measuring the temperature of the device by, for instance, measuring the surface temperature, the junction temperature, or the change in voltage across the device when the current density is supplied (which is described below). The inventors have found that heating of the small area devices described in the exemplary experiment below was negligible for current densities that were less than 40 mA/cm$^2$ (e.g. the temperature increase of the individual organic emissive device was less than 2° C.).

This accelerated lifetesting process relies on the assumption that the degradation mechanism is essentially the same at the high current densities used to measure the acceleration factor (Af) as it is at the extrapolated lower current densities. While this process is reliable for individual organic emissive devices (due in part because of their small surface area relative to a substrate and/or any heat generated may be dissipated relatively easily), this lifetesting process cannot be relied upon to accurately predict lifetimes of devices when different degradation mechanisms are introduced during the accelerated testing.

In this regard, direct accelerated lifetesting at high current density cannot be used to accurately predict lifetime for organic emissive panels (which typically have large surface areas) because, at high current density, even the most efficient large area organic emissive panel generates significant heat over a large area that cannot easily be dissipated. This heat could be generated, for example, by Joule heating in the bus lines and electrodes or non-emissive exciton decay. This can lead to high temperatures and temperature gradients across the organic emissive panel, which may result in rapid and non-uniform aging. Extrapolation of lifetimes from high to low current density is thereby extremely difficult. The problem of heat generation in OLED devices is described in detail in Lu et al., *OLED Requirements for Solid-State Lighting*, Information Display (October 2010), and the idea of panel design for low temperature is described in greater detail in Levermore et al., *Phosphorescent OLEDs: Lighting the Way for Energy-Efficient Solid-State Light Sources*, Information Display (October 2010), each of which is hereby incorporated by reference. Accurate extrapolation from high to low current density is thus extremely difficult and often not reliable for large area organic emissive panels using the above described direct accelerated lifetesting.

Methods and processes are provided herein that may be used to measure the lifetime of large area organic emissive panels. Embodiments provide for the use of an indirect method of accelerated lifetesting of large area devices by determining the junction temperature at which the organic emissive panel operates at a selected luminance and then utilizing lifetest data calculated for equivalent individual organic emissive devices at the calculated junction temperature. Embodiments may thereby provide the advantages of accelerated lifetesting to large area organic emissive panels without the need to supply large current densities to the panels as in direct accelerated lifetesting, which, as noted above, may result in unreliable results.

Moreover, using the junction temperature as opposed to the surface temperature of the device provides for more accurate results in extrapolating the lifetime of the large area organic emissive panels. Although lifetime predictions based on the surface temperature of a panel could also be used, these temperatures would typically be lower than the junction temperature of the device and thereby would result in a considerable over-estimate of the predicted panel lifetime. Therefore, it is preferable to use the junction temperature of the organic emissive panel for such lifetime extrapolation.

In this regard, embodiments include determining the average junction temperature across an organic emissive panel at a selected luminance level. Any method or apparatus may be used to determine the junction temperature of the panel. Thus, although two specific methods are discussed in detail below, it is contemplated that any method may be used to measure or predict the junction temperature including, but not limited to, characterization of emission spectra at different temperatures (see e.g. Tessler et al., *Current Heating in Polymer Light Emitting Diodes*, Applied Physics Letters, Vol. 73:6 (Aug. 10, 1998)); and infrared (IR) imaging (see, e.g. Zhou et al., *Real-Time Observation of Temperature Rise and Thermal Breakdown Processes in Organic LEDs Using an IR Imaging and Analysis System*, Advanced Materials, Vol. 12:4 (2000)), each of which is hereby incorporated by reference. Another method that may be used to predict or determine the junction temperature of the organic emissive panel is to measure the surface temperature of the panel above the emissive regions of the device, which is described below with regards to the exemplary experiment. These measurements are typically lower than the actual junction temperature (for reasons described below), but may generally be used to estimate the junction temperature.

The results of the lifetime testing represent the longest lifetime that can be achieved for the given OLED stack and organic emissive panel layout if the panel is well encapsulated and does not suffer catastrophic failure through, for instance, shorting of the device. An advantage that some embodiments of the method presented herein may provide is that they allow the lifetime of organic emissive panels with large areas to be accurately measured much faster using an indirect accelerated lifetesting method rather than a non-accelerated lifetest. Embodiments may also reduce the chance of catastrophic failure of the organic emissive panel during a lifetest because, for instance, high current density need not be applied to the panel, which also improves data yield. Embodiments may also be used to optimize thermal management systems that are designed to reduce panel operating temperature, and thereby enhance panel lifetime.

Embodiments may also provide the advantage of determining lifetime data without the need to lifetest a large area organic emissive panel, which are typically more expensive than an individual organic emissive devices (with small relatively small area) because the lifetime of the panel may be determined by lifetesting the less expensive individual organic emissive devices and relating the data to the organic emissive panel.

As will be described in greater detail below with reference to FIGS. 5-14, the inventors have used this approach to determine the lifetime of an organic emissive panel with a junction temperature that is less than 30° C. when operating at 3,000 cd/m$^2$. This low junction temperature is expected to enable excellent panel lifetime.

Although the description of embodiments of the method provided herein relate to organic light emitting devices, the methods and principles may have equal applicability to other areas of electronic devices. To the extent that the lifetimes are difficult to measure for large devices based on considerations such as the generation and ability to dissipate heat, and the use of equivalent small area devices may be reliably used to predict lifetime of the larger devices, these applications of the methods disclosed herein are also contemplated as within the scope of the invention. Moreover, embodiments of this method may also provide a much more cost efficient manner of determining the lifetime data of such devices.

Figure 3:
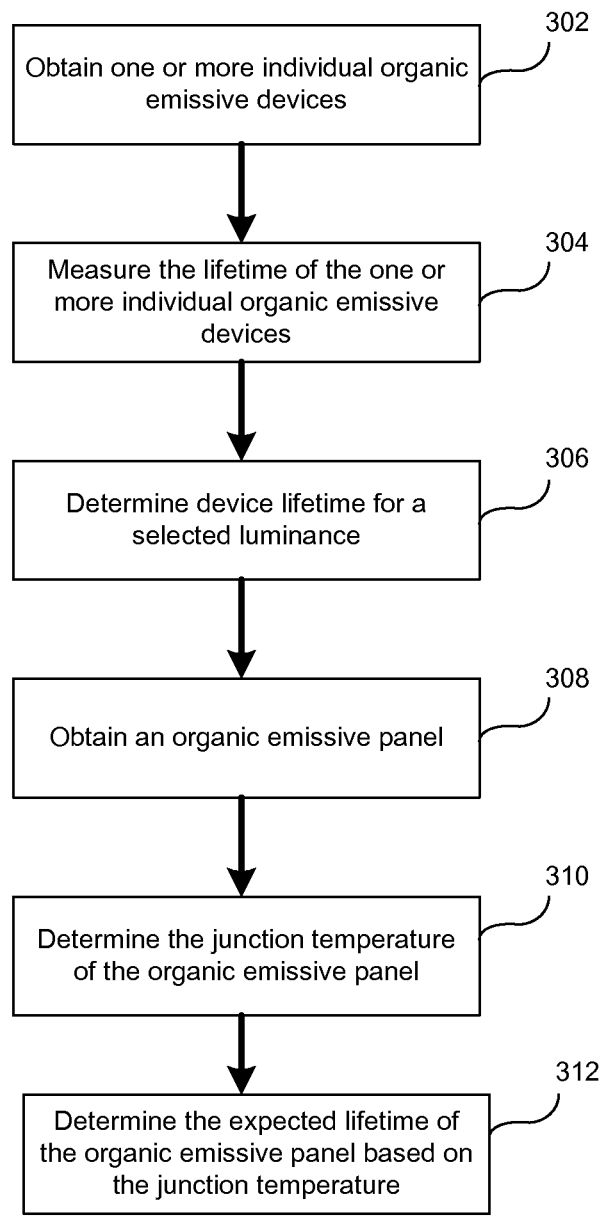
FIG. 3 shows a flow chart of an exemplary method for determining the expected lifetime of an organic emissive panel.

With reference to FIG. 3, an exemplary method for lifetesting a large area organic panel is provided.

At step 302, one or more individual organic emissive devices are obtained, each of which has a first organic stack that comprises one or more organic layers. Any method for obtaining an organic device may be utilized, including fabricating the devices using any suitable method, including those described above. In some embodiments, the plurality of individual organic devices and/or components thereof may be acquired, such as by purchase from a third party. These individual organic emissive devices typically have a small surface area relative to the substrate and generate low amounts of heat even when energized (and even when operated at relatively high current density), which is usually easy to dissipate. The specific characteristics and structure of these devices is not important so long as they are equivalent to each other. Preferably, the individual organic emissive devices are designed such that methods for accelerated lifetesting may be performed to produce reliable lifetime estimates for these devices (including those methods that were described above). In some embodiments the organic emissive devices could be fabricated on a large area organic emissive panel, such as on the side of the panel.

At step 304, the lifetime of the one or more individual organic emissive devices is measured at one or more ambient temperatures at a non-heating current density. Preferably, the ambient temperature of the device is controlled by using a thermally controlled environment. The lifetime may be, for instance, the time it takes for the luminance level of the organic emissive devices to degrade to a percentage of the initial luminance level. The lifetime may be any value, but is typically determined in part by the application or purpose of the device. For instance, the lifetime may be set as a percentage of the initial luminance level at which the organic emissive devices would no longer be ideal for a given application. For example, the lifetime values may be determined based on the time it takes for the luminance of the device to degrade to 80% of the initial luminance level.

Continuing with step 304, the lifetime of the one or more individual organic emissive devices may be measured in a number of ways. In some embodiments the lifetime of each of the plurality of the organic emissive devices is measured at a range of ambient temperatures at a constant current density. For instance, a plurality of the emissive devices may be energized at a constant current density, and each of the devices is lifetested at a different ambient temperature, such as at 20° C., 30° C., 40° C., 50° C., etc.

The ambient temperature of the device may be controlled in any manner, including a temperature controlled chamber (e.g. an oven), heating plate, or other external heat control. Although it is preferred to test the devices at an ambient temperature that is equal to the environmental temperature because, inter alia, it is typically an easier and a more reliable means for measuring the ambient temperature of the individual organic emissive devices, it should be understood that a device could be heated apart from its environment and lifetest measurements taken at range of such ambient temperatures. For instance, rather than placing the device in a thermally controlled environment (which controls the environmental temperature), in some embodiments, the device itself could be locally heated (i.e. heat could be supplied apart from the overall environment, such as by a hotplate). As noted, such an approach is not preferred because it may introduce difficulties in measuring an accurate ambient temperature of the device to be used for the determining the lifetime versus ambient temperature data. In some embodiments, multiple devices may be tested at a single ambient temperature, and the lifetimes of the devices tested at the same ambient temperature may be combined to avoid statistical outliers that could effect the results.

In some embodiments, at step 304 the one or more individual organic emissive devices may be lifetested at a range of current densities and a range of ambient temperatures. For instance, life tests may be performed at current densities of 10, 20, and 40 mA/cm$^2$ at ambient temperatures in the range of 20-70° C. The lifetests may be accelerated lifetests; that is, the current densities at which the individual organic emissive devices are lifetested may be relatively high in comparison to the current density at a selected luminance (such as the current density at the operating luminance level) to accelerate degradation of the devices. In some embodiments, the lifetime of the individual organic emissive devices may then be extrapolated for a selected luminance from the measured lifetime data of the devices at each of the ambient temperatures.

At step 306, lifetime data for a selected luminance level may be determined. For instance, if the measurements in step 304 were performed using current densities that were greater or less than the current densities at the selected luminance, the lifetime of the individual organic emissive devices may be determined by extrapolating this data as described above.

In some embodiments (e.g. embodiments where lifetime was measured at a range of ambient temperatures), a relationship may be determined between device lifetime and ambient temperature at a selected luminance (and associated current density) based upon the measured lifetimes of the plurality of devices. The selected luminance may be any value, but is typically determined in part by the application or purpose of the device. For instance, the selected luminance may be the luminance level at which the device is expected to operate.

The relationship between device lifetime and ambient temperature describes how the lifetime of the devices may change based on the temperature of the device. Typically, as temperature increases, device lifetime decreases. The relationship may be defined as the gradient of the linear fit of a plot of the lifetime data on a logarithmic scale versus temperature (on an absolute scale) for the individual organic emissive devices, as determined in some embodiments at step 304. In some embodiments, this defines a linear relationship, which makes interpolation and extrapolation of lifetimes to other temperatures more reliable.

It should be noted that in some embodiments, the relationship between temperature and lifetime for the individual organic emissive devices may not depend on the current density supplied to the device. That is, the gradient of the plot of the lifetime versus temperature is approximately the same, regardless of current density. This is typically the case for low current densities because the localized heating is expected to be minimal, as described above. Thus, the relationship determined between the lifetime of the individual organic emissive devices and temperature at one current density also provides the relationship between lifetime and temperature at a different current density (i.e. the proportional change in lifetime due to the change in temperature is the same). In some embodiments, determining the gradient at one current density, even if not the current density corresponding to the selected luminance, may still be used to define the relationship at the selected luminance level. This provides the advantage that the relationship between lifetime and temperature need only be measured and determined at one current density, and can then be utilized in lifetime predictions for multiple luminance levels.

At step 308, an organic emissive panel is obtained (e.g. fabricated or acquired) using a second organic stack that consists essentially of the one or more organic layers of the first organic stack. In some embodiments, the second organic stack is structurally and/or functionally equivalent to the first organic stack. The language "consists essentially of," "structurally equivalent," and "functionally equivalent" were each defined above. In general, this language is meant to convey the notion that the organic stacks should be similar (e.g. they should function similarly and therefore have similar lifetimes at the same current density and temperatures), but need not be identical.

Any method for obtaining an organic device may be utilized, including fabricating the devices using any suitable method, including those described above. In some embodiments, the organic emissive panel and/or components thereof may be acquired, such as by purchase from a third party. In some embodiments, the organic emissive panel is a large area device, which may generate significant heat over a large area that cannot easily be easily dissipated. This heat could be generated, for example, by Joule heating in the bus lines and electrodes or non-emissive exciton decay. This can lead to high temperatures and temperature gradients across the organic emissive panel, which may result in rapid and non-uniform aging.

At step 310, the junction temperature of the organic emissive panel is determined. As defined above, the junction temperature is the temperature within the organic stack, and in particular, within the emissive layers (EMLs) or directly adjacent to the EMLs. As detailed above, large area devices generate heat, which is typically not easily dissipated, and therefore operate at a temperature that is higher than ambient temperature. Moreover, there is a direct relationship between device lifetime and temperature. It is therefore necessary to determine the temperature at which the device operates at when driven by a particular current density (e.g. at the selected luminance) so as to accurately determine the panel lifetime. It is preferable to use the junction temperature rather than the surface temperature of the device for this calculation because the junction temperature is a more accurate reflection of the operating temperature of the organic material and should thereby give more accurate lifetime estimates. Two methods for determining junction temperature are described with respect to FIGS. 4(*a*) and (*b*). However, the junction temperature may be determined using any suitable means.

At step 312, the lifetime of the organic emissive panel is determined based at least in part on the junction temperature at the selected luminance. In some embodiments, the determination may also be based upon the relationship between device lifetime and ambient temperature of the individual organic emissive devices at the selected luminance determined at step 306. For instance, the panel lifetime may be determined by calculating the lifetime of the organic emitting devices at an ambient temperature that is approximately equal to the junction temperature that was determined for the organic emissive panel in step 310. As noted above, in step 306 the relationship between ambient temperature and individual organic emissive device lifetime was determined for the selected luminance (e.g. by measuring lifetime using a constant current density at the selected luminance level at the range of ambient temperatures; by accelerating lifetesting individual organic emissive devices at a range of ambient temperatures and then extrapolating the lifetime at the selected luminance at each of the temperatures, etc.) which, when the device lifetimes are put on a logarithmic scale, should be represented by a linear relationship. Using this linear relationship, the lifetime of the individual organic emitting devices at an ambient temperature approximately equal to the junction temperature (and congruently the lifetime of the organic emissive panel) may then be determined at the selected luminance level.

Embodiments Utilizing Measured Lifetime at Junction Temperature

Figure 8:
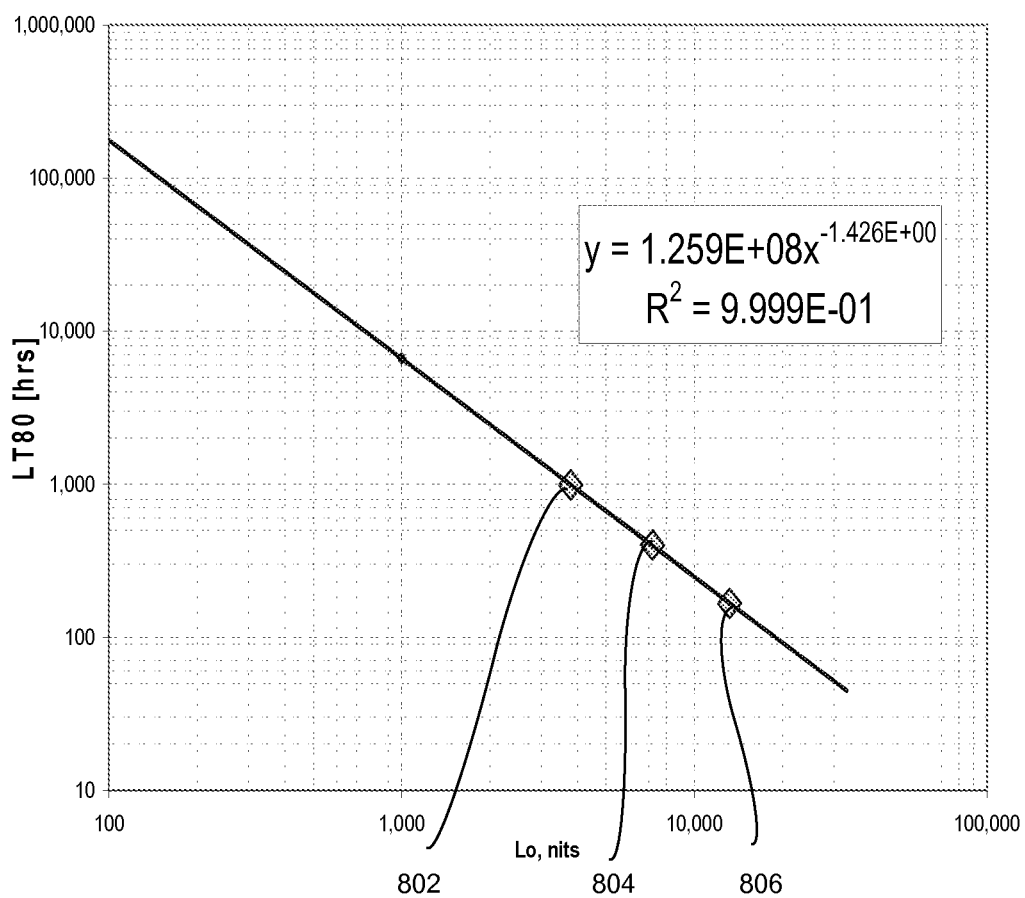
FIG. 8 shows a graph of lifetime vs. luminance for an exemplary device.

In some embodiments, at step 304 the lifetime of each of the one or more individual organic emissive devices are measured at an ambient temperature that is approximately equal to the junction temperature of an equivalent organic emissive panel. Determining the junction temperature of the large area organic emissive panel will be discussed in more detail below. In some embodiments, the individual organic emissive device lifetime at the selected luminance may be determined at step 306 by performing an accelerated lifetime test of the individual organic emissive devices. The accelerated lifetime test may include measuring the lifetime of a plurality of the individual organic emissive devices at a range of current densities. Typically the current densities are higher than the current density for the selected luminance. The device lifetime at the selected luminance and at an ambient temperature that is approximately equal to the junction temperature may then be determined at step 312 by extrapolation using the linear fit of the plot of the lifetime versus luminance plot. An example of such a plot is shown in FIG. 8. The determined device lifetime for the selected luminance based on the accelerated lifetest is also the expected lifetime of the equivalent large area organic emissive panel.

This embodiment offers the advantage of only requiring lifetesting of the individual organic emissive devices at a single ambient temperature (i.e. the junction temperature). Moreover, accelerated lifetesting need only be performed once, rather than potentially for a plurality of iterations at difference ambient temperatures. Therefore, this embodiment may reduce costs and decrease the overall time needed to determine the device lifetime of the large area organic emissive panel. However, the junction temperature at the selected luminance level should be known in advance of the life testing of the individual organic emissive devices.

In some embodiments, rather than performing an accelerated lifetest at an ambient temperature that is approximately equal to the junction temperature to extrapolate the lifetime of the individual organic emissive devices at the selected luminance, at step 304 a lifetest may be performed on an individual organic emissive device at the selected luminance and an ambient temperature that is approximately equal to the junction temperature. The measured lifetime of the individual organic emissive device in some embodiments is the expected or determined lifetime for the large area organic emissive panel at the selected luminance. This embodiment offers the advantage of only having to lifetest one individual organic emissive device, thereby potentially saving on cost, time, and the sophistication of the equipment needed to perform the lifetest. It may of course be desirable to perform multiple lifetests at the selected luminance and an ambient temperature that is approximately equal to junction temperature if an average or other statistical certainty is desired.

General Embodiments

One reason as to why embodiments of the methods discussed above are effective for measuring organic emissive panel lifetime is that the calculated junction temperature is the approximate temperature at which the organic materials in the panel operate at for a selected luminance. Because the organic stacks of the individual organic emitting devices and the organic emissive panel are equivalent, the lifetime of the individual organic emitting devices measured at an ambient temperature that is approximately equal to the junction temperature at the selected luminance (assuming the selected luminance requires a non-heating current density) represents the same conditions that the organic material experiences within the organic emissive panel at the selected luminance.

In some embodiments the organic emissive panel comprises at least three different types of organic stacks, and the lifetime of at least one of the different stacks is measured using any of the methods discussed herein. Typically, organic emissive panels comprise a red, a green and a blue emitter so as to be capable of providing a plurality of different colors (such as in a display) or white light (such as in a light panel). In some embodiments, the lifetime of the panel may be limited by the organic stack that has the shortest lifetime because when one organic stack no longer is ideal or suitable for its purpose, the quality of the light emissions of the entire panel may be reduced or unacceptable. Preferably therefore, the lifetest is performed on the organic stack known or believed to have the shortest lifetime, which lifetime would then reflect the lifetime of the panel.

In some embodiments, the organic emissive panel may comprise a lighting panel or a display. A lighting panel is a device that is generally not able to display different images (although it may be able to display an image), the pixels are not individually controlled, and typically the device is either on or off (although some embodiments may permit the display of different colors such as for mood setting or dimming). A display is a device that generally comprises individually controllable pixels and is typically capable of displaying a wide variety of images. A common type of display is an RGB display, however, there are many more types of display panels. In some embodiments, when determining the junction temperature for a lighting panel, the process involves energizing the panel to a selected luminance and allowing the panel to operate for a sufficient amount of time (i.e. until the temperature becomes constant). In some embodiments, when determining the junction temperature of a display, the process involves setting a number of the display pixels to display "white" for a sufficient amount of time (i.e. until the temperature becomes constant). In either case, the panel should be operated under conditions that mimic the operating temperature.

In some embodiments, and as described above with respect to some implementations of step 304, the measuring of the lifetime of each of the plurality of individual organic emissive devices is performed by an accelerated lifetime test. This may be done, for example, when the current density at the selected luminance is relatively low, and would therefore require a long lifetest if performed at that luminance level. In some embodiments, a plurality of the individual organic emissive devices may be lifetested at each of the ambient temperatures at a range of current densities that are greater than the current density at the selected luminance. The lifetime of the individual organic emissive devices at the selected luminance may then be extrapolated at each temperature based on these lifetests, and the extrapolated lifetime data versus temperature plot may be used to determine the relationship between lifetime and ambient temperature, as discussed in regards to some embodiments in step 306.

In some embodiments, each of the individual organic emissive devices has a surface area of not more than about 1 $cm^2$. As noted above, the smaller area devices typically generate less heat, and any heat that is generated may be more easily dissipated. This characteristic typically provides for more accurate and reliable determinations of lifetimes of the organic emissive panels using an indirect lifetest method. Thus, it may be preferable for each of the individual organic emissive devices to have a surface area of not more than about 2 $mm^2$. Moreover, in some embodiments the organic emissive panel has a surface area of at least about 1000 $mm^2$. Typically, it is difficult to determine lifetimes of these devices because, as discussed above, when operated at relatively high current densities, the panels generate heat which cannot be easily dissipated. Methods disclosed herein may be used to perform accelerated lifetests of these devices.

In some embodiments, the method may further comprise determining that the organic emissive panel has an expected lifetime above a threshold lifetime value, a junction temperature below a threshold temperature, or both, and then selecting the organic emissive panel for use from among a plurality of organic emissive panels. It is desirable to have devices that have long lifetimes because they do not need to be replaced as often and also typically operate at higher quality for longer periods of time. Embodiments of the methods disclosed herein provide a means by which the lifetime of panels can be predicted or determined in advance, which can aid in the selection of better devices. Furthermore, as temperature is correlated with lifetimes, the decision to select a particular device may also be made, at least in part, based on the junction temperature of the device when energized to the selected luminance.

In some embodiments, each of the plurality of individual organic emissive devices is a separate pixel. That is, each may be located on a separate substrate. In some embodiments, the pixels may be located on a single substrate or multiple substrates, and may even be located on an organic emissive panel or other large area device.

In some embodiments, the method may further comprise determining the expected lifetime for a plurality of organic emissive panels and then selecting at least one of the plurality of organic emissive panels based upon (1) the expected lifetime of the at least one organic emissive panel, (2) the junction temperature of the at least one organic emissive panel, or both. In some embodiments, the method may be used to compare a plurality of panels that have different organic stacks to determine, e.g., which device is likely to have the longest lifetime or lowest junction temperature at a selected luminance level. This can thereby aid in the selection of the best devices for a particular application. In some embodiments, each of the plurality of organic emissive panels may also comprise the same or an equivalent organic stack structure. In these embodiments, the panels may comprise an equivalent organic stack, but the device itself may have other differences that either increase or decrease the efficiency (and or the junction temperature) of the device at different selected luminance. This may be used, for example, to determine which type of heat extraction or dissipation systems work best to reduce junction temperature and/or increase the lifetime of the device. In some embodiments, the selected organic emissive panels have a junction temperature of not more than about 40° Celsius. This is a relatively low junction temperature, which may indicate that the panel will have desirable lifetime parameters.

Continuing with the embodiments discussed above, the method may further comprise constructing an organic light-emitting device apparatus using the selected at least one organic emissive panel. The light emitting device apparatus may be any suitable device that may use an organic emissive panel, such as a light panel or display. The device apparatus may also comprise a general purpose light fixture. A light fixture may comprise any one of, or some combination of any of the following: a light source or lamp; a reflector; an aperture; a lens; a power supply; a connection to a power source; and/or a light socket to hold the lamp.

In some embodiments, following the completion of the lifetime determination of the organic emissive device, a comparison may be made to the expected operating conditions of the panel to determine whether the organic emissive panel is suitable for its intended use. If the determination is that the panel is suitable for the intended use, then the organic emissive panel is operated at the selected luminance.

Exemplary Methods for Determining Junction Temperature

Figure 4:
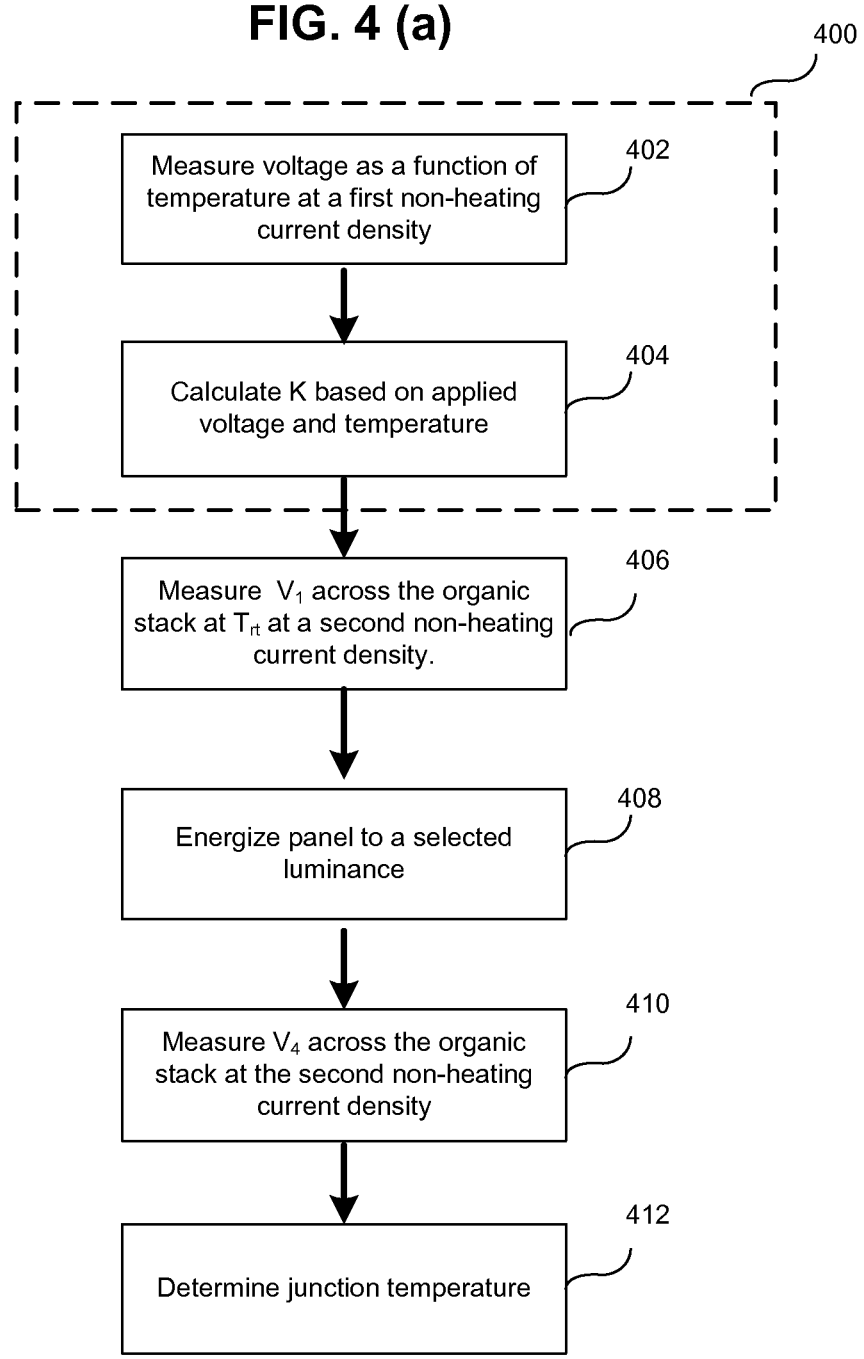
FIG. 4 shows two flow charts of exemplary methods for determining junction temperature.

With reference to FIG. 4, two methods for determining the junction temperature of the organic emissive panel are described. As noted above, however, any manner of determining the junction temperature of the organic emissive panel may be used in conjunction with the methods described herein. The methods for measuring junction temperature described herein utilize an indirect method based on the change in voltage across the panel and a corresponding relationship with the junction temperature of the panel, which is given by the equation $\Delta T = K(\Delta V)$; where $\Delta T$ is the change in the junction temperature; K is the "K factor" and defines the relationship between the change in voltage and the corresponding change in temperature; and $\Delta V$ is the change in voltage across the panel. The junction temperature of the panel can then be calculated using the equation $T_j = T_{rt} + K(\Delta V)$, where Tj is the junction temperature and $T_{rt}$ is an initial temperature (e.g. ambient temperature). The methods of measuring the junction temperature provided herein may have the benefit that they require relatively simple equipment for determining junction temperature, whereas more complex ways of determining junction temperature may implicate cost considerations.

With reference to FIG. 4(a), a method of determining junction temperature using non-heating current densities to, inter alia, determine the value of K, is described. In the inventors lab for most devices fabricated, 1 mA/cm$^2$ gave this result. The inventors note that for some devices this current density may not work, but that one of ordinary skill in the art should be able to readily determine an appropriate current density at which heating does not occur with a series of simple experiments involving the application of a current to a desired panel and measuring when and whether any heating begins to occur.

Generally at step 400, the relationship K between applied voltage and ambient temperature for the organic emissive panel at a first non-heating current density is determined. This may be done using any suitable method, which is why this appears in a dashed box labeled as step 400 in FIG. 4(a). Steps 402 and 404 are exemplary steps that may be used in determining K, but any suitable method may be used.

At step 402, the voltage across the organic stack in the organic emissive panel is measured as a function of ambient temperature at a first non-heating current density. Preferably, the measurements are made in a thermally controlled environment. For instance, the voltage across the panel is measured at a low current density (e.g. J=0.1 mA/cm$^2$) such that the junction temperature of the panel is approximately equal to the ambient temperature. In some embodiments, a thermally-controlled environment is used to control the ambient temperature of the panel (e.g. an oven). As noted above, there may be otherways to control and measure the ambient temperature of the panel, such as by using a heating plate, which would be readily understood by one of ordinary skill in the art. The ambient temperature of the organic emissive panel may be set to any appropriate range of values (e.g. 20, 30, 50° C., etc.).

At step 404, the value for K is calculated as the gradient of a linear fit of the measured voltages versus ambient temperature collected in 402. That is, the gradient of this plot gives the value for 1/K (based on the equation $\Delta T = K(\Delta V)$). It should be noted that the K-factor may vary based on the current density that is used in these measurements (i.e. the first non-heating current density). It is expected that a larger K-factor (shallower slope) will be found at lower current densities. The K-factor will be used in determining the junction temperature in step 412. Furthermore, while the plot of the measured voltages versus ambient temperature is expected to have a linear relationship at relatively low temperatures (such as operating temperatures typically in the range of 20° C. to 70° C.), but depending on the characteristics of the device, as ambient temperatures reach more extreme values (e.g. greater than 70° C.) this may no longer be the case. In determining the K-Factor of an organic emissive panel, it is preferable to measure lifetime at ambient temperature ranges where the relationship is still linear, which a person of ordinary skill in the art could readily determined based on the particular device that is being tested.

In some embodiments, the first non-heating current density is not more than about 1 mA/cm². This is because as current density to the organic emissive panel increases, the panel junction temperature is likely to begin to increase as well. For purposes of determining the K-factor in this exemplary method, the current density should be selected so that heating does not occur (or any heating that does occur is not material or can be dissipated). For panels tested in the inventor's lab, values of the current density above 1 mA/cm² when applied to the panel increased the panel temperature.

Figure 11:
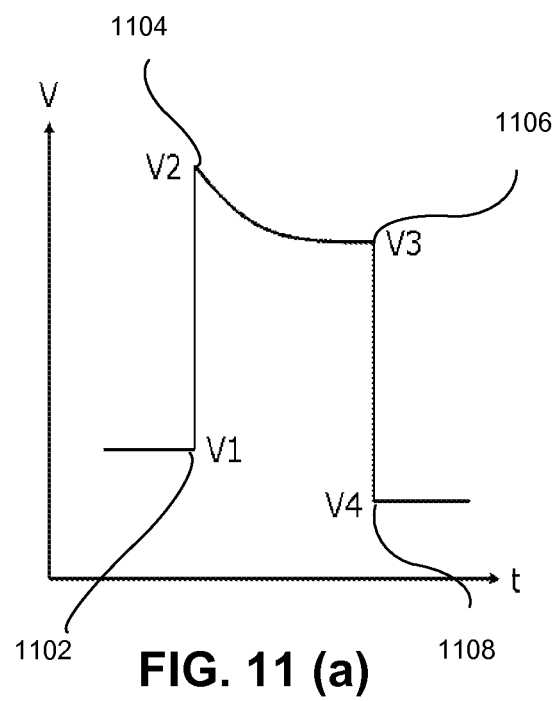
FIG. 11 shows two graphs of voltage versus time.
Figure 11:
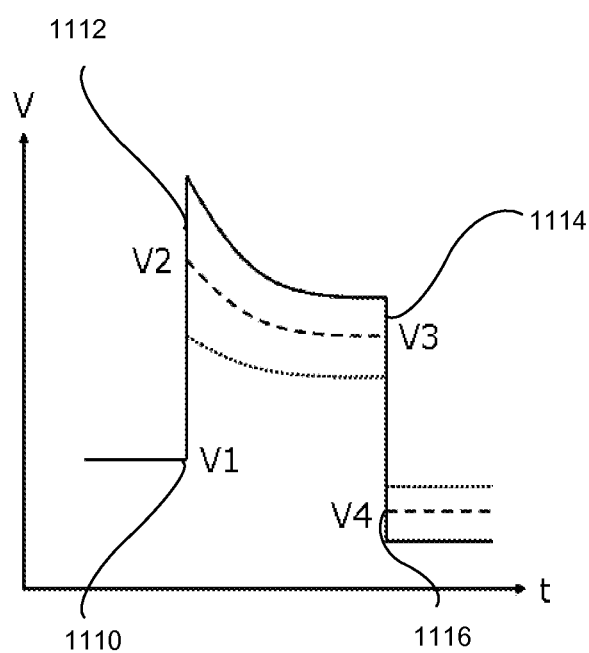

At step 406, a first voltage $V_1$ is measured across the organic stack at a first temperature $T_{rt}$ of the panel at a second non-heating current density. That is, $V_1$ is measured at the ambient temperature, before any heating of the panel due to the current density occurs. Preferably, $V_1$ is measured as soon as the second non-heating current density is applied to the organic emissive panel. FIG. 11(*a*), which is described in more detail below, is illustrative of the measurement of $V_1$ at point 1102. The second non-heating current is preferably a low current density, such as 0.1 mA/cm². Preferably, the first non-heating current density and the second non-heating current density used the determine the K-factor in step 400 are the same. In some embodiments, the second non-heating current density is not more than about 1 mA/cm², for the same reasons noted above with regard to the first non-heating current density.

At step 408, the organic emissive panel is energized to approximately the selected luminance such that a second temperature higher than the first temperature is reached. Typically, the selected luminance requires a relatively high current density, particularly in comparison to the non-heating currents used in steps 400-406. For instance, the current density may be 5 mA/cm². Usually supplying this high current density to the panel will increase the panel temperature. Preferably the panel should be energized at the selected luminance for a sufficient period of time such that the voltage across the panel is stable. As used herein, the term "stable" refers to when the voltage across the stack (or the organic emissive panel) is relatively constant for a period of time. For example, in some embodiments, a voltage is stable if the voltage across the stack does not change by more than 0.1% for a period of at least 10 seconds. Of course, this may vary based on the device and other variables (such as power supply). However, it is within the understanding of one of ordinary skill to art to determine when the voltage is relatively constant. When the voltage has stabilized across the panel, it is an indication that the panel has reached a junction temperature that is associated with operating the device at the selected luminance.

At step 410, a second voltage $V_4$ is measured across the organic stack at a second temperature of the panel at the second non-heating current density. That is, the current density supplied to the panel is reduced from the current density required for the selected luminance back down to the second non-heating current density. Immediately (or as close as possible) after the current density is reduced, the voltage across the panel should be measured so that the panel junction temperature is still at (or near) the junction temperature when the panel is operated at the selected luminance level. This is the value $V_4$.

FIG. 11(*a*) is illustrative of the process of obtaining the voltages for $V_1$ and $V_4$. The voltage $V_1$ is initially measured at point 1102 using a non-heating current density, before the organic emissive panel is energized to the selected luminance and while the panel is at ambient temperature. When the panel is energized to the selected luminance (e.g. at step 408), the voltage across the panel increases to point 1104. As the panel remains energized at the selected luminance, the panel temperature increases and correspondingly the voltage across the panel begins to drop (shown between points 1104 and 1106). After some time, the panel temperature will become relatively constant (including the junction temperature) and the voltage will thereby become constant while operating at the selected luminance, shown at point 1106. When the panel reaches point 1106, the current density is reduced so that the panel is no longer energized at the selected luminance, which brings the voltage across the panel back down to point 1008, and a relatively small non-heating current is applied so as to measure the voltage $V_4$. This measurement should be taken immediately (or as close as practically possible) when the panel is no longer energized at the selected luminance so that the junction temperature of the panel is still at the operating temperature at the selected luminance. Typically, $V_4$ is less than $V_1$, even though the same non-heating current density is applied to the panel, because the junction temperature of the panel is higher when measuring $V_4$.

At step 412, the junction temperature $T_j$ of the panel is determined using the equation $T_j = T_{rt} + K(\Delta V)$, where $\Delta V$ is $(V_1 - V_4)$. This is then the junction temperature of the panel that may be used in the methods described above, inter alia with reference to FIG. 3, to determine the life time of the organic emissive panel.

With reference to FIG. 4(*b*), a second method of determining junction temperature of the organic emissive panel at the selected luminance is disclosed. This method utilizes a pulse applied current density, rather than a non-heating current density to determine the relationship K between applied voltage and ambient temperature for use in the equation $\Delta T = K(\Delta V)$. As would be understood by a person of ordinary skill in the art, the pulse applied current density comprises a pulse width, a separation between pulses, an average current density, and a peak current density. The "average current density" is equal to the (peak current density)×(pulse width)/(pulse width+separation between pulses), which is the same as the peak current density times the duty cycle (where the duty cycle is the (pulse width) divided by the sum of the (pulse width) plus the (separation between the pulses)). Preferably, the average current density is a non-heating current density. The "peak current density" is the current density measured during the pulse on time.

Generally at step 420, the relationship K between applied voltage and ambient temperature for the panel at the pulse applied current density is determined. This may be done using any suitable method, which is why this step appears in a dashed box labeled as step 420. Steps 422 and 424 are exemplary steps that may be used in determining K, but any suitable method may be used.

At step 422, the panel may be placed in a thermally-controlled environment, and voltage across the organic stack in the organic emissive panel is measured as a function of ambient temperature at the pulse applied current density. Other means of controlling the ambient temperature of the panel, such as by supplying heat directly to the panel (e.g. using a hot plate), while not necessarily preferred, may also be used to measure the lifetime at a range of ambient temperatures. As noted above, the K-factor may vary based on the current density that is used in these measurements, and thus preferably the peak current density is the same as the current density that energizes the panel to approximately the selected luminance to provide accurate measurements for the junction temperature.

The application of the pulse applied current density preferably does not increase the temperature of the organic emissive panel so that measurements may be made at ambient temperature. Therefore, the shorter the pulse widths, the less the average current density that is applied, and the less heat that will be generated. It is therefore preferable that the pulses of the pulse applied current density are less than 20 ms. It is more preferable that the pulses are less than 10 ms, particularly if the selected luminance requires a large current density (as noted above the peak current density is preferably equal to the current density at the selected luminance). For similar reasons, it is preferable that the pulse duty cycle (which takes into consideration the frequency of the pulses (i.e. the separation between pulses) is less than 25%. It is also preferable, particularly when the target luminance requires a relatively high current density, that the pulse duty cycle is less than 10%. Furthermore, although the peak current density is dictated by the current density required for the panel to be energized to the target luminance, in some embodiments the peak current density may be at least 5 mA/cm$^2$. Moreover, some applications may require an even greater current density, and thus in these embodiments, the peak current density may be at least 10 mA/cm$^2$.

The voltage should be measured at the pulse on time of the pulse applied current density (that is, when the peak current is supplied). The ambient temperature of the panel may be set to a range of values (e.g. 20, 30, 50° C., etc.) and measurements of the voltage are taken at each ambient temperature. At step 424, the value for K is calculated as the gradient of a linear fit of the measured voltages versus ambient temperature collected in 422. That is, the gradient of this plot gives the value for 1/K (based on the equation $\Delta T = K(\Delta V)$). It should be noted that the K-factor may vary based on the current density that is used in these measurements It is expected that a larger K-factor (shallower slope) will be found at lower current densities. The K-factor will be used in determining the junction temperature in step 432. Also, as described above, the temperature range selected for these measurements should be values at which the panel lifetime versus temperature relationship remains linear. Again, the inventors have found for the exemplary organic emissive panel described below, this relationship was approximately linear at temperatures in the range of 20° C. to 70° C.

At step 426, a first voltage $V_2$ is measured across the organic stack at a first temperature $T_{rt}$ of the panel at a first heating current density. The reference to $T_{rt}$ (i.e. ambient temperature) refers to the fact that this measurement is preferably made immediately (or as soon as possible) when the first heating current density is applied because organic emissive panels typically heat up rather quickly (on the order of milliseconds). The inventors have found that most pulse generators are capable of making this measurement. The voltage $V_2$ is preferably not taken when the voltage is dropping as the junction temperature increases. Preferably, the first heating current density is the current density supplied to the organic emissive panel to energize the panel to the selected luminance.

At step 428, the panel is energized to the selected luminance for a period of time that is sufficient for the voltage across the panel to stabilize, wherein the term "stable" was discussed above. Until the voltage stabilizes, the organic emissive panel is likely continuing to increase in temperature. When the voltage across the panel stabilizes, the panel has reached the junction temperature at which it will operate.

At step 430, a second voltage $V_3$ is measured across the organic stack at a second temperature of the panel at the first heating current density. That is, after the panel has been energized to the selected luminance for a sufficient time such that the voltage is stabilized (and hence the panel is at a second temperature that is grater than the ambient temperature because of the heating of the panel) the voltage $V_3$ may be measured across the panel. Thus, $V_3$ is also a measurement of a stable voltage, which corresponds to the voltage across the panel at the selected luminance when the panel is at the junction temperature at which it will operate.

FIG. 11(a) is illustrative of the process of obtaining measurements for the voltages for $V_2$ and $V_3$. The organic emissive panel is initially energized to the selected luminance and the voltage $V_2$ is immediately measured (or as close as possible) at point 1104, when the panel temperature should be at or near ambient temperature. As the panel remains energized at the selected luminance, the panel temperature increases and correspondingly the voltage across the panel begins to decrease (shown between points 1104 and 1106). After some time, the panel temperature will become relatively constant (at the junction temperature for the selected luminance) and the voltage will thereby become constant while operating at the selected luminance, shown at point 1106. When the panel reaches point 1106, the voltage $V_3$ is measured. Typically, $V_3$ is less than $V_2$, even though the same current density is applied to the panel, because the junction temperature is higher when measuring $V_3$.

At step 432, the junction temperature $T_j$ of the panel is determined using the equation $T_j = T_{rt} + K(\Delta V)$, where $\Delta V$ is $(V_2 - V_3)$. This is the junction temperature of the organic emissive panel that may be used in the methods described above to determine the lifetime of the panel.

Although as mentioned above, any method may be used to determine junction temperature, the inventors have found that the method described with respect to FIG. 4(a) is preferred over the method described with respect to FIG. 4(b) in part because at high current density, the built in resistive losses may become significant, and may therefore require correction.

However, the pulse applied current density method described with respect to FIG. 4(b) may also be used at low current density (which may reduce some of these problems typically associated with using a high current density). That is, the peak current density of the pulse applied current density could also be a non-heating current density (such as 0.1 mA/cm$^2$, as used with respect to FIG. 4(a)). The junction temperature could then be determined by measuring the voltages $V_1$ and $V_4$ during the pulse on time, and then utilizing the measured difference in voltage to determine junction temperature, as described above. In some embodiments, this may offer a practical way to measure $V_4$. For instance, by utilizing a pulse generator, $V_4$ can be measured very close to (and perhaps almost instantaneously) when the current is reduced from the current at which the panel operates at the selected luminance to the non-heating current density. This may be advantageous, in part, because the organic emissive panel junction temperature (and thereby the voltage across the panel) may begin to materially change on the order of milliseconds.

Exemplary Embodiment

An exemplary embodiment will now be generally described in greater detail below. This exemplary embodiment is for illustration purposes, and is no way meant to limit the scope of the embodiments discussed above. It is simply provided here for illustration purposes.

In this exemplary embodiment, a series of small area individual organic emissive devices are obtained (for instance fabricated or otherwise acquired) with an equivalent organic stack to the organic stack that will be used in a large area organic emissive panel for which the lifetime will be measured. As described above, the organic stacks of the individual organic emissive devices and organic emissive panel do not have to be identical, but they should be functionally similar.

Next, an accelerated lifetest for the individual organic emissive devices is performed at a range of high current densities and at a range of ambient temperatures (e.g. 10, 20, 40 mA/cm$^2$ at 20-70° C.), which may be controlled by using a thermally controlled environment (e.g. an oven), heating plate, or other external controls. In some embodiments, the individual organic emissive devices may be lifetested using a single current density that energizes the panel to the selected luminance. Preferably, the current densities for the lifetesting are selected such that heating that results from the current density is minimal for the individual organic emissive devices. In this case, because of the small area of the devices, the junction temperature should be approximately equal to the ambient temperature for the individual organic emissive devices at these current densities. This can be confirmed by measuring the voltage change for the individual organic emissive devices upon initial illumination and as the current densities are supplied. If the voltage does not change (or the change is minimal) than the junction temperature is approximately equal to the ambient temperature.

The next step is to plot the lifetimes on a logarithmic scale (Log(LT)) versus the initial luminance levels on a logarithmic scale (Log(Lo)) for each temperature. These plots are expected to be linear for current densities that do not cause significant heating of the individual organic emissive devices (e.g. current densities less than 40 mA/cm$^2$). Therefore, the plots may then be used to extrapolate the lifetime (e.g. LT80) at the initial selected luminance level Lo at each ambient temperature based on the linear fit of the data.

The extrapolated lifetimes for the individual organic emissive devices at the selected luminance level at each ambient temperature may then be utilized to determine the relationship of the individual organic emissive devices to ambient temperature at the selected luminance. That is, a plot may be made of the lifetimes that were extrapolated from the lifetime measurements at each ambient temperature. This gives the selected luminance level versus the ambient temperature of the devices (e.g. Log(LT) vs. ambient temperature (K)). The plot is expected to be linear, and thereby lifetime may be extrapolated using the linear fit of the data. As noted above, the relationship of lifetime versus ambient temperature may no longer be linear (even for individual organic emissive devices) at extreme ambient temperatures (e.g. at temperatures greater than 70° C.). It is preferable that measurements be taken at a range at which the device lifetime versus ambient temperature is linear, which may readily be determined by a person of ordinary skill in the art by taking simple measurements of the individual organic emissive device and constructing an appropriate plot as described above.

A large area organic emissive panel is then obtained (e.g. fabricated or otherwise acquired, such as by purchase from a third party) having an equivalent organic stack to that used in the individual organic emissive devices.

The organic emissive panel is then placed into a thermally controlled environment and the voltage is measured as a function of ambient temperature at a non-heating current density. Other methods for controlling and measuring the temperature of the panel may also be used. As discussed above, two possible methods are provided for determining junction temperature in detail below (exemplary Methods 1 and 2). However, any manner of determining the junction temperature of the organic emissive panel may be used.

Exemplary Method 1: The voltage across the panel is measured at different ambient temperatures at low current density $J_{low}$ (e.g. 0.1 mA/cm$^2$) such that junction temperature is approximately equal to the ambient temperature. In the exemplary experiment discussed in detail below, this method was used to measure the junction temperature of the panel.

Exemplary Method 2: The voltage across the panel is measured at different ambient temperatures at high current density $J_{high}$, but where the high current density is applied in short pulses, such that heating within the device remains insignificant. A preferred pulse on time would be less than 20 ms, or more preferably less than 10 ms. Preferably, the current density that is supplied provides the selected luminance Lo (which is measured during the pulse on time; i.e. the peak current) for which the lifetime of the panel is to be predicted. Note that when using high current density voltage pulses, the pulse duty cycle is preferably also low because it is expected that the temperature of sub-micron thickness organic layers will rapidly rise upon application of high current density. A preferred duty cycle would be less than 25%, or more preferably less than 10%. A further concern is that at high current density, built in resistive losses may become significant, and these resistive losses may need correction. For at least these reasons, exemplary Method 1 for determining junction temperature is typically preferred.

Next, the measured voltages are plotted against the associated ambient temperature for the organic emissive panel. The gradient of this plot gives 1/K for this device stack and large area panel layout. The relationship to determine the junction temperate is again given by the equation $\Delta T_j = K \times \Delta V$, where $T_j$ is the junction temperature. As noted above, the "K-factor" may change with current density. It is expected that a less steep slope giving a larger K-factor at lower current density. The K-factor can be used to determine the junction temperature of the organic emissive panel based on whether exemplary Method 1 (non-heating current) or exemplary Method 2 (pulse applied voltage) was used for determining the K-factor.

If exemplary Method 1 was used above to determine the value of K for the organic emissive panel, then the panel junction temperature may be determined by measuring voltage ($V_1$) at room temperature ($T_{rt}$), or at whatever ambient temperature that the panel lifetime is to be predicted. This may be determined by applying a low current density $J_{lo}$, (e.g. 0.1 mA/cm$^2$). The panel may then be driven at high current density $J_{high}$ (e.g. 10 mA/cm$^2$) to achieve the desired selected luminance Lo at which junction temperature and lifetime are to be measured. After waiting for the voltage to stabilize, the current density supplied to the panel is turned back to $J_{low}$ and voltage is immediately measured ($V_4$). Even though current density at which the voltage is measured is the same, $V_4$ is expected to be lower than $V_1$ due to heating in the panel caused by $J_{high}$, such that $\Delta V_{low}=V_1-V_4$. This change in voltage enables the measurement of the junction temperature when operated at the selected luminance. $\Delta V_{low}$ may be substituted into $\Delta T_j=K\times\Delta V$ to give $\Delta Tj$, and finally the junction temperature may be determined as $T_j=T_{rt}+\Delta T_j$. In some embodiments, $V_4$ may be used with a plot of voltage versus ambient temperature for the panel to determine the junction temperature. $V_1$ and $V_4$ are shown with reference to FIG. 11(a), which was described in detail above.

If exemplary Method 2 was used above to determine the value of K, than the organic emissive panel junction temperature may be determined by driving the panel at high current density $J_{high}$ (e.g. 10 mA/cm$^2$) such that the selected luminance level Lo is achieved. The voltage may be measured when the current density is initially applied ($V_2$) and again after the voltage has stabilized ($V_3$). $V_3$ is expected to be lower than $V_2$ based in part on the heating caused by $J_{high}$, such that $\Delta V_{high}=V_2-V_3$. $\Delta V_{high}$ may be substituted into $\Delta T_j=K\times\Delta V$ to give $\Delta Tj$, and finally the junction temperature may be determined as $T_j=T_{rt}+\Delta T_j$. In some embodiments, $V_3$ may be used with a plot of voltage versus ambient temperature for the panel to determine the junction temperature. $V_2$ and $V_3$ are shown with reference to FIG. 11(a), which was described in detail above.

In the exemplary experiment described in detail below, the inventors used Method 1 to determine junction temperature. This approach was preferred based in part because the use of pulsed signals are not required (which as noted above may result in other considerations that must be accounted for). Additionally, Method 1 described above allows for the rapid measurement of junction temperatures at multiple luminance levels using a single K-factor determined. In contrast, if Method 2 was used a separate K-factor would have to be determined for each high current density.

The junction temperature can then be used with the plot of the lifetime for the individual organic emissive devices at the selected luminance level on a logarithmic scale versus the ambient temperature on an absolute scale (e.g. Log(LT) vs. ambient temperature (K)) to determine lifetime for the organic stack in the given panel architecture.

Exemplary Experiment of an Exemplary Method for Lifetesting

The inventors have performed an embodiment of the method described above to determine the lifetime of a large area organic emissive panel. The results of that process will be described below for illustrations purposes only. It should be understood that this example is not meant to be limiting.

Figure 5:
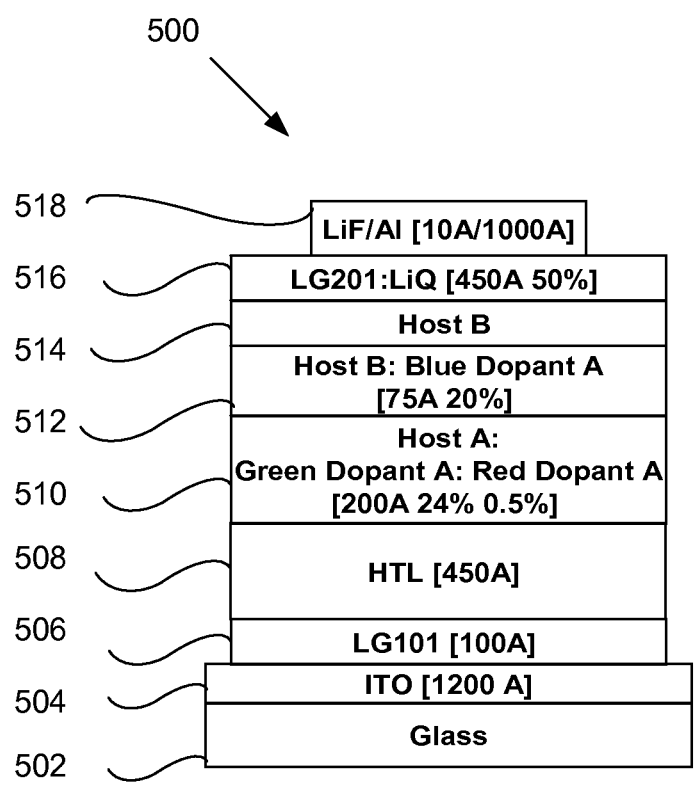
FIG. 5 shows an exemplary organic device.

The OLED device stack used in the inventors' experiment is shown in FIG. 5. The exact details of the device structure are not critical. As noted above, the device structure need only be equivalent for both the individual organic emissive devices and the large area organic emissive panels. As described above, the device structures should be structurally and/or functionally similar, though small variations in, for example, the dopant concentration or layer thicknesses may still be acceptable. In this exemplary experiment, the individual organic emissive devices and organic emissive panels were fabricated using VTE deposition with approximately the same vacuum level during deposition, and all other preparation conditions were approximately the same.

FIG. 5 shows the device structure used for this exemplary experiment. Device 500 is fabricated on a substrate 502 comprising glass, and includes, in order, anode 504 comprising ITO [1200A]; solution processed organic hole injection layer 506 comprising LG 101[100A], solution processed organic hole transport layer 508 [450A]; solution processed organic emissive layer 510; VTE deposited organic emissive layer 512; VTE deposited organic blocking layer 514 comprising Host B; VTE deposited organic electron transport layer 516 comprising LG 201: LiQ [450A 50%]; and cathode 518 comprising LiF/Al [10A/1000A]. Solution processed organic emissive layer 510 includes a host (Host A) and green (Green Dopant A) and red (Red Dopant A) emitting dopants [200A 24% 0.5%], and VTE deposited organic emissive layer 514 includes a host (Host B) and a blue emitting dopant (Blue Dopant A) [75A 20%].

Figure 6:
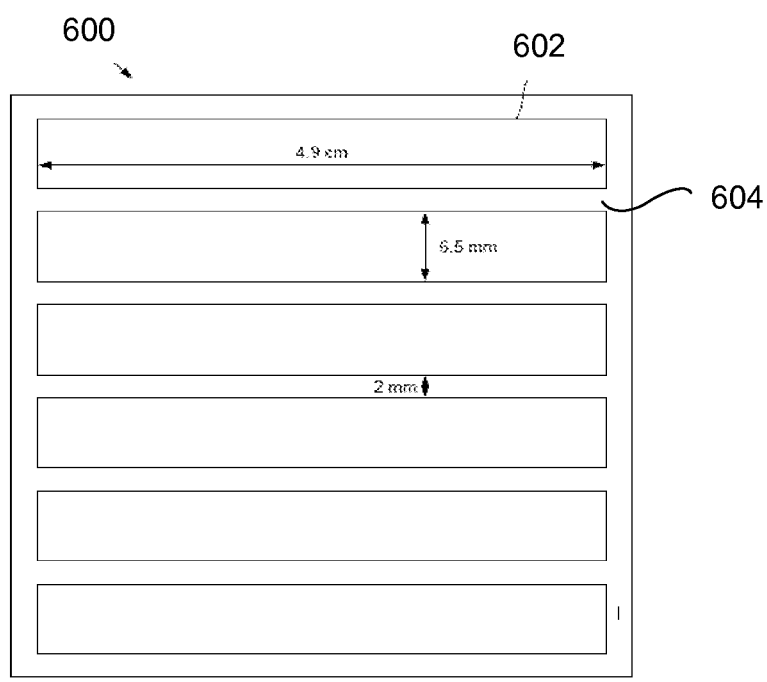
FIG. 6 shows dimensions of an exemplary organic device.

The individual organic emissive devices fabricated for this experiment had a surface area of approximately 2 mm$^2$. With reference to FIG. 6, the layout of the organic emissive panel 600 used in this exemplary experiment is shown. The large area panel fabricated for this experiment had a surface area of approximately 1,911 mm$^2$. The panel has emitting regions 602; and non-emitting regions 604. In this exemplary experiment, each of the small area individual organic emissive devices and large area organic emissive panels were fabricated with equivalent organic stacks.

Figure 7:
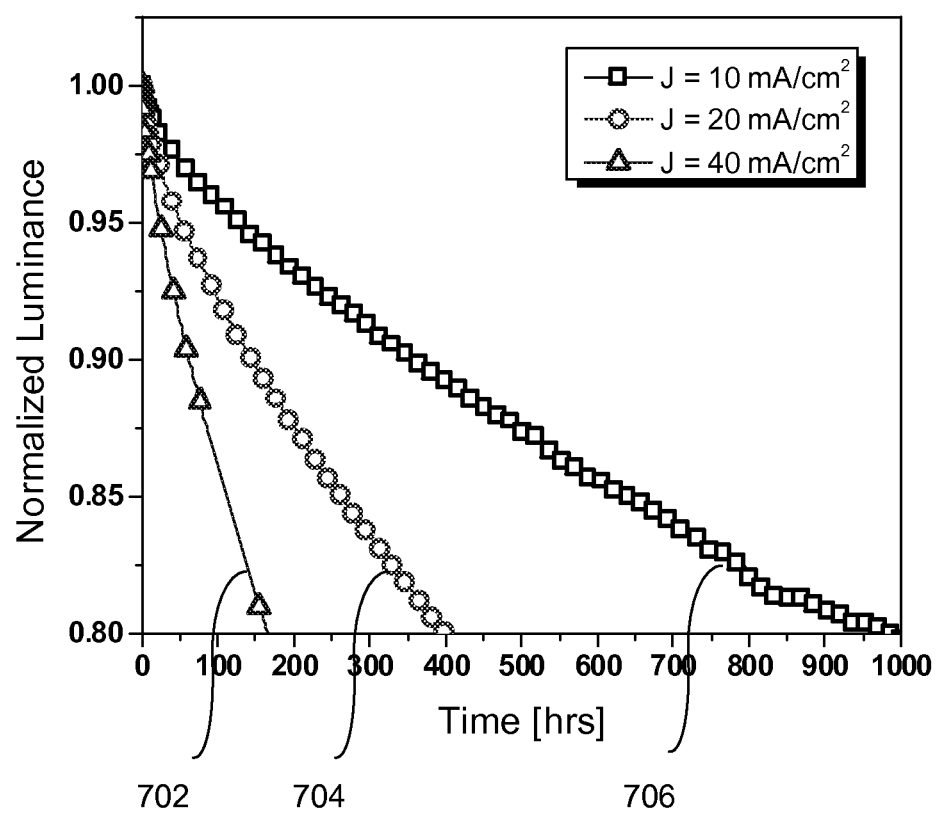
FIG. 7 shows a graph of luminance vs. lifetime for an exemplary device.

The small area individual organic emissive devices were put onto lifetests at an ambient temperature equal to room temperature (approximately 20° C.) and at constant current densities of 10, 20 or 40 mA/cm$^2$. The luminance level and voltages for the small area individual organic emissive devices were measured as a function of time. The results of these lifetests are illustrated in FIG. 7, which shows the normalized luminance plotted against time. The line 702 represents the results of the lifetest at a current density of 40 mA/cm$^2$; line 704 represents the results of the lifetest at a current density of 20 mA/cm$^2$; and line 706 represents the results of the lifetest at a current density of 10 mA/cm$^2$. The intersection of each of lines 702, 704, and 706 with the X-axis in FIG. 7 shows the time for the small area organic emissive devices in this experiment to degrade to a luminance level of approximately 80% (LT80) of the initial luminance level. For instance, the results show that the time to reach LT[80] was approximately: 160 hrs at a current density of 40 mA/cm$^2$; 400 hrs at a current density of 20 mA/cm$^2$; and 1000 hrs at a current density of 10 mA/cm$^2$.

FIG. 8 shows an accelerated lifetime plot for the individual organic emissive devices for the exemplary experiment. In FIG. 8, the lifetime to LT80 [hrs] is plotted against the initial luminance Lo [cd/m$^2$] on a logarithmic scale for the devices for each of the current densities noted above (measured at an ambient temperature of approximately 20° C.). For instance, point 802 represents the LT80 for the individual organic emissive device at current density 10 mA/cm$^2$; point 804 represents the LT80 for the device at current density 20 mA/cm$^2$; and point 806 represents the LT80 for the device at current density 40 mA/cm$^2$. This plot may be utilized to determine the acceleration factor for equivalent devices. The acceleration factor (Af) is the gradient of linear fit of the plot shown in FIG. 8. The acceleration factor may then be used to extrapolate the lifetime of equivalent devices at lower current densities (and hence lower luminance levels) then those tested by using the equation: $t_2=t_1\times(L_1/L_2)^{Af}$, a process which was described above. For this exemplary experiment, the acceleration factor Af was found to be 1.426 and the least squares fit $R^2$ was 99.99%. This relatively high least squares fit shows the strong linear relationship of the lifetime of the individual organic emissive devices at different current densities, and also illustrates why this is a reliable way for extrapolating the lifetimes of equivalent devices at lower (or higher) current densities. This process is the standard means by which lifetime at lower luminance is extrapolated for small area organic emissive devices.

Figure 9:
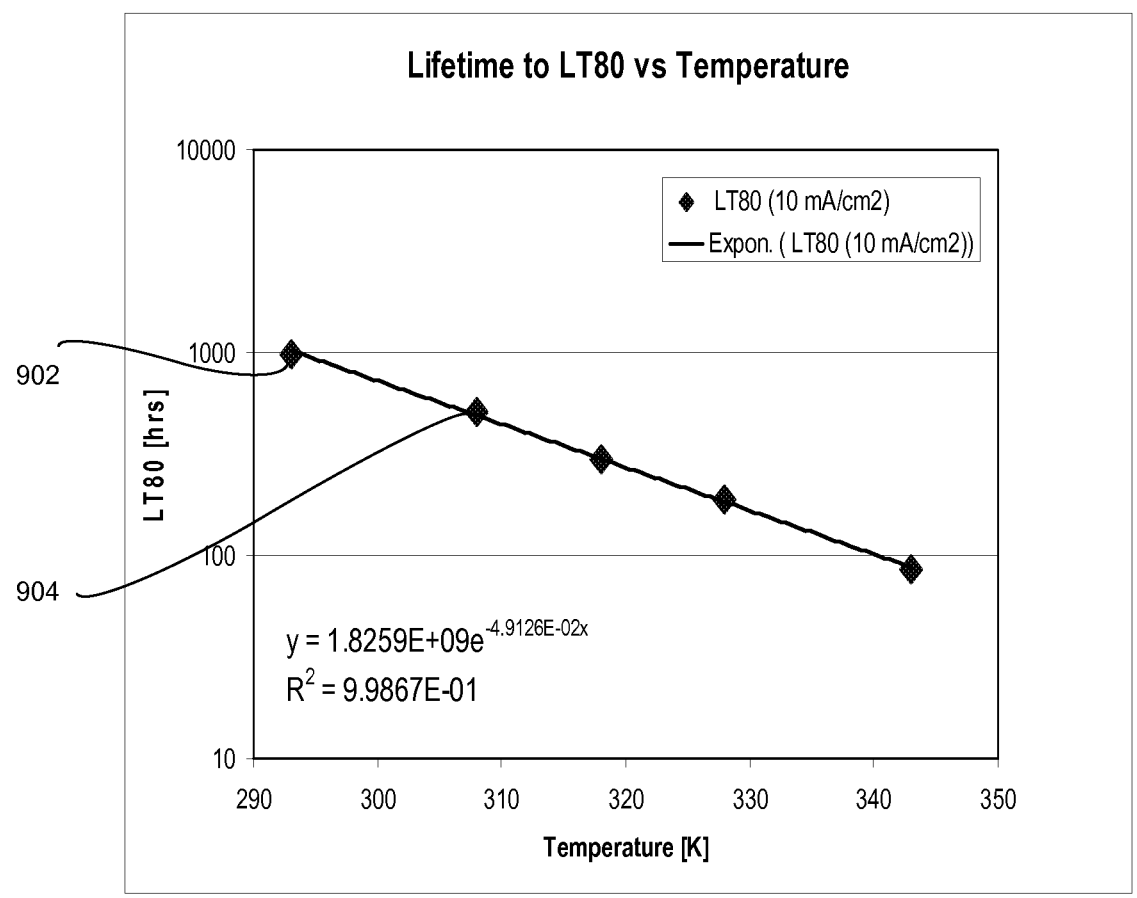
FIG. 9 shows graph of lifetime vs. temperature for an exemplary device.

Continuing with the description of the exemplary experiment, equivalent individual organic emissive devices were then placed onto a lifetest and operated at a constant current density of 10 mA/cm² in a thermally controlled environment at the following ambient temperatures: 20° C., 35° C., 45° C., 55° C., and 70° C. The time taken for the small area devices to reach LT80 (i.e. 80% of the initial luminance) was then recorded at each temperature. FIG. 9 shows a plot of LT80 vs. ambient temperature [K] for the individual organic emissive devices. This plot shows the relationship between lifetime and temperature. For instance, point 902 shows that at an ambient temperature equal to approximately room temperature (20° C.), the LT80 was approximately equal to 988 hrs at a current density of 10 mA/cm². When the ambient temperature is increased to 35° C. while maintaining the current density at the same level (10 mA/cm²), LT80 is reduced to 509 hrs as shown at point 904. This shows that for the exemplary experiment, a 15° C. increase in ambient temperature can reduce lifetime of the individual organic emissive devices by a factor of nearly two (approximately 1.94). This relatively large reduction in lifetime demonstrates the need to design organic emissive panels with a low operating junction temperature.

As described above, for the individual organic emissive devices, heating is expected to be minimal because any heat that is generated is usually relatively easy to dissipate. Thus, for these small area devices, the junction temperatures are expected to be approximately equal to ambient temperatures. For example, a 2 mm² device having an ambient temperature of 20° C. when operated at 10 mA/cm² is expected to have a junction temperature of approximately 20° C. (the ambient temperature). The inventors have verified this assumption for the individual organic emissive devices used in this exemplary experiment, which will be described below. For this experiment, at 10 mA/cm² the luminance measured at normal incidence to the small area devices prior to any aging (Lo) was 3,780 cd/m². This was the target luminance at which the inventors were to determine the organic emissive panel lifetime in this exemplary experiment. As noted above, the target luminance is arbitrary and may be selected at any level, but is typically chosen to represent the luminance level at which the panel will operate. If a lower luminance level were required, then, for instance, a lower current density could be used for this series of lifetime measurements at the range of temperatures for the individual organic emissive devices.

Although not performed by the inventors in this exemplary experiment, other methods may be used for determining the relationship between the lifetime of equivalent devices and ambient temperature, as described above. In some embodiments, if the selected luminance and junction temperature for the organic emissive panel are known, one could measure the lifetime of an individual organic emissive device at an ambient temperature equal to the junction temperature, and at a current density that operated at the selected luminance. In some embodiments, a plurality of individual organic emissive devices could be lifetested at a range of current densities at an ambient temperature approximately equal to the junction temperature of the panel, and the lifetime for the devices could be extrapolated to a lower current density (i.e. indirect accelerated lifetesting of the panel). As noted above, it is preferable that the current densities chosen for these measurements are such that the individual organic emissive devices do not generate a significant amount of heat (e.g. the junction temperature of the individual organic emissive devices does not increase above the ambient temperature by more than approximately 2° C.). As described above, a person of ordinary skill in the art could readily determine such a range of current densities by supplying current densities to the device and determining if there is such an increase in temperature by taking measurements to determine junction temperature (as described above).

Determining Junction Temperature for a Large Area Organic Emissive Panel

The inventors also determined the junction temperate of the large area organic emissive panel. As noted above, any method for determining junction temperature may be used. FIG. 6 again shows the panel design used for the exemplary experiment. As noted above, the exemplary methods described herein could readily be applied to alternative large area emissive panel designs or other similar type devices. An equivalent device architecture was used for the large area emissive panels in this work as used for the individual organic emissive devices, which was described with reference to FIG. 5. The organic emissive panel was placed into a temperature controlled environment and voltage was measured across the panel at different ambient temperatures from 36.9° C. to 56.6° C. In this exemplary experiment, the inventors used the non-heating current method for determining the K factor, which was described in detail with reference to FIG. 4(*a*) (i.e. a low current density was applied to the panel: $J_{low}$=0.1 mA/cm²).

Figure 10:
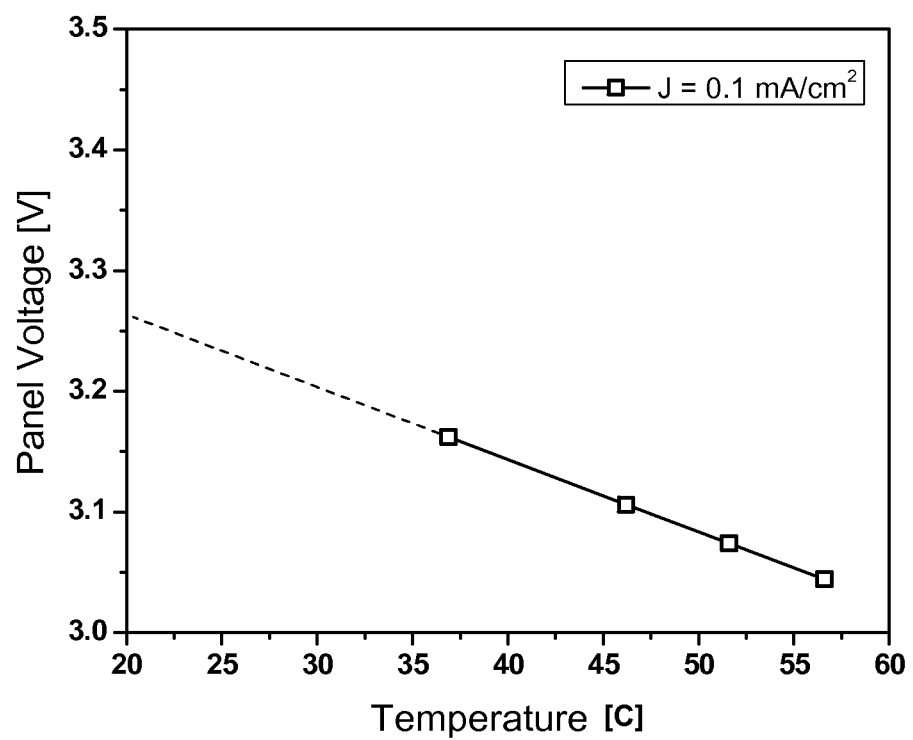
FIG. 10 shows a graph of voltage versus temperature for an exemplary device.

The results for the exemplary experiment are shown in FIG. 10. Table 1 below summarizes the results by showing the measured voltage at a range of ambient temperatures with a constant current density ($J_{low}$) equal to 0.1 mA/cm² for a large area organic emissive panel with equivalent organic stack to the individual organic emissive devices.

TABLE 1

| Ambient Temperature [° C.] | Voltage at $J_{low}$ = 0.1 mA/cm² [V] |
|---|---|
| 36.9 | 3.162 |
| 46.2 | 3.106 |
| 51.6 | 3.074 |
| 56.6 | 3.044 |

As the inventors expected, the measured voltage dropped as the ambient temperature increased. The K-factor for an equivalent large area emissive panel is the inverse gradient of the approximate linear fit of the plot in FIG. 10. Thus, in the exemplary experiment, the K-factor was calculated for this large area emissive panel at $J_{low}$=0.1 mA/cm² to be 166.949. Thus, at a current density of 0.1 mA/cm², an increase in voltage by 0.1 volts indicates that there is a decrease in the junction temperature of approximately 16.695° C.

Once the K-factor was determined, which may be substituted into the equation $\Delta T_j = K \times \Delta V$, the inventors then determined $\Delta T_j$ (change in junction temperature) of the panel based on the change in voltage ($\Delta V$) across the organic emissive panel during operation at the target luminance. At room temperature (20° C.), the change in voltage ($\Delta V$) was measured for the equivalent large area organic emissive panel at a series of current densities, corresponding to different luminance levels. In this way, the junction temperature could be calculated for the equivalent large area panel at different luminance levels. This process is described in more detail with reference to FIG. 11(*a*) and FIG. 11(*b*).

With reference to FIG. 11(*a*) and FIG. 11(*b*), the measurements were performed as follows: The panel was operated at $J_{low}$=0.1 mA/cm² and an initial voltage was measured at point 1102 ($V_1$). This is the voltage across the panel at ambient temperature. The current density was then increased to 2, 5, 10 and 20 mA/cm², and the voltage was immediately measured at point 1104 ($V_2$). As noted above, "immediately" means that $V_2$ at point 1104 should be measured prior to any material heating of the equivalent large area emissive panel occurs from the application of the increased current densities.

Table 2 below shows voltage, luminance (luminance is shown without any light extraction enhancement) and junction temperature data measured for the organic emissive panel for the different current densities described above:

TABLE 2

| Current Density [mA/cm$^2$] | Luminance [cd/m$^2$] | $V_1$ [V] | $V_2$ [V] | $V_3$ [V] | $V_4$ [V] | $\Delta V$ ($V_1 - V_4$) [V] | $\Delta T_j$ [° C.] | $T_j$ ($T_{rt} + \Delta T_j$) [° C.] | $T_j$ Extrapolated [° C.] |
|---|---|---|---|---|---|---|---|---|---|
| 2 | 870 | 3.254 | 3.959 | 3.942 | 3.241 | 0.013 | 2.2 | 22.2 | 23.8 |
| 5 | 2,110 | 3.254 | 4.348 | 4.280 | 3.223 | 0.031 | 5.2 | 25.2 | 26.8 |
| 10 | 3,800 | 3.254 | 4.735 | 4.556 | 3.178 | 0.076 | 12.7 | 32.7 | 34.2 |
| 20 | 7,660 | 3.254 | 5.140 | 4.814 | 3.095 | 0.159 | 26.5 | 46.5 | 48.0 |

For instance, $V_2$ at point 1104 should be measured before the panel junction temperature increases by 1° C. In this exemplary experiment, luminance was also measured at normal incidence to the large area organic emissive panel for each current density. Continuing with reference to FIG. 11(*a*), the panel was energized at each of the current densities until a stable voltage was reached at point 1106 ($V_3$). Again, as described above, "stable" means that the voltage remained relatively constant for a period of time (e.g. there was a voltage change of not more than 0.1% for a period of 10 seconds). As can be seen from FIGS. 11(*a*) and (*b*), $V_3$ (at points 1106 and 1114, respectively) will likely be at a lower value than $V_2$ (at points 1104 and 1112, respectively) because of the increase in temperature of the panel due to the heating of the panel caused by energizing it at the selected luminance levels.

Continuing with the exemplary experiment, the current density supplied to the organic emissive panel was then turned back to a low current density $J_{low}$=0.1 mA/cm$^2$ and voltage was measured immediately at point 1108 ($V_4$). As noted above, "immediately" means that $V_4$ at point 1108 should be measured prior to any material change in temperature of the equivalent organic emissive panel occurs from reducing the current density. For instance, $V_4$ at point 1108 should be measured before the panel junction temperature decreases by 1° C. The difference between $V_1$ and $V_4$ is given by $\Delta V_{low}=V_1-V_4$. The change in voltage ($\Delta V_{low}$) may be used with data for $J_{low}$=0.1 mA/cm$^2$ in FIG. 10 to calculate the large area emissive panel junction temperature at 2, 5, 10 or 20 mA/cm$^2$, as described in detail above. That is, using the equation that relates the change in junction temperate of the panel to the change in voltage ($\Delta T_j = K \times \Delta V$), the inventors determined the change in junction temperature ($\Delta T_j$) for each current density based on the difference in the measured voltages. The inventors then determined the junction temperature ($T_j$) of the panel using the equation $T_j = T_{rt} + \Delta T_j$, where $T_{rt}$ is the ambient temperature of the device (in this case room temperature or 20° C.) and $\Delta T_j$ is the change in junction temperature at each current density.

In another embodiment, the junction temperature of the panel when operated at each of the current densities can also be determined by using the difference between the measured voltage when the current density ($J_{high}$) is initially applied at point 1104 ($V_2$) and the voltage at point 1106 ($V_3$) when the voltage stabilizes. In other words, the difference between $V_2$ and $V_3$ is given by $\Delta V_{high}=V_2-V_3$. As described above, $\Delta V_{high}$ could also be used to calculate the organic emissive panel junction temperature in the same manner as $\Delta V_{low}$. However, the K-factor would be determined by the second method of determining the junction temperature (i.e. using the pulse applied current density) described above.

Figure 12:
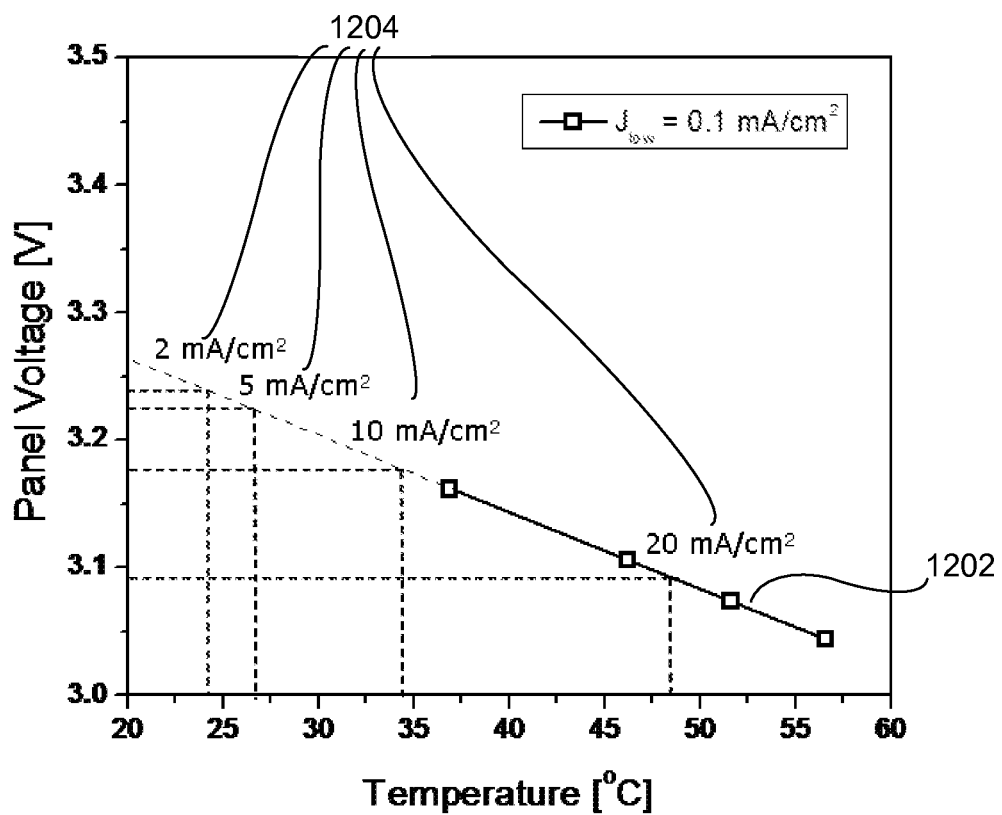
FIG. 12 shows a graph of voltage versus temperature with extrapolation for an exemplary device.

In this exemplary experiment, the data for the change in junction temperature was determined using $\Delta T_j = K \times \Delta V$, where $\Delta V = V_1 - V_4$ for each of the current densities. The final columns of Table 2 show junction temperature calculated for the exemplary large area organic emissive panel at various current densities: 2, 5, 10 and 20 mA/cm2. In this regard, the junction temperatures were calculated in two different ways: (1) using $T_j = T_{rt} + \Delta T_j$, where room temperature $T_{rt}$ was approximately 20° C., and (2) by extrapolation of the panel voltage versus temperature plot in FIG. 10. This extrapolation is shown in FIG. 12, where extrapolated junction temperatures were obtained by matching the voltages measured at point 1204 ($V_4$) to the line-of-best fit in the voltage vs. temperature plot in FIG. 10. As Table 2 shows, the results are similar, but not identical. There is a measurement spread of approximately ±0.8° C., with the extrapolation method giving a slightly higher predicted junction temperature.

This same process for determining the junction temperature of the large area emissive panel may be used to verify that the junction temperature of the individual organic emissive devices is approximately equal to the ambient temperature (an assumption that was made to permit direct accelerated lifetesting of the small area devices). The inventors thereby took similar measurements to those performed for the large area emissive panel for the individual organic emissive devices. Then, using the same techniques described above for determining the junction temperature for the large area emissive panel, and with the current density $J_{low}$=10 mA/cm$^2$, the inventors measured the voltages $V_1$ and $V_4$ for the individual organic emissive devices in the same manner described above. The results showed that the change in voltage ($\Delta V = V_1 - V_4$) was equal to −0.003 V for the individual organic emissive devices. This change in voltage is insignificant, and provides strong evidence that junction temperature is approximately equal to the ambient temperature for equivalent individual organic emissive devices operating at 10 mA/cm$^2$, thereby affirming the validity of the assumption.

It should be noted that the average luminance at normal incidence of the exemplary organic emissive panel used in this experiment at 10 mA/cm$^2$ was 3,800 cd/m$^2$. This is slightly higher than the luminance level for an equivalent individual organic emissive device (3,780 cd/m$^2$), but the values are very similar. This again demonstrates the reproducibility of the experiment as well as the equivalence of the organic device structures.

It should also be noted that the junction temperatures of the organic emissive panel are extremely low in comparison to other light sources (such as LEDs or incandescent bulbs). Indeed, at 5 mA/cm$^2$, the junction temperature $T_j$ is approximately equal to 26° C., while at 10 mA/cm$^2$ the junction temperature $T_j$ is approximately equal to 33° C. It should again be noted that the luminance values in Table 2 do not include any light extraction enhancement. A commercial light extraction film (e.g. Clarex DR-90C) could readily be used to achieve a 1.5× light extraction enhancement. In this case, luminance values would thereby increase by 1.5×. Hence, in this exemplary experiment the inventors have demonstrated that a large area emissive light panel that has a junction temperature ($T_j$) approximately equal to 26° C. at a luminance of 3,165 cd/m$^2$ and a junction temperature ($T_j$) approximately equal to 33° C. at a luminance of 5,700 cd/m$^2$. These are unprecedentedly low junction temperatures. Thus, it is expected that the organic emissive panel would have the advantage of a relatively longer lifetime at a given luminance level in comparison to other luminance devices.

Experimental Confirmation of Junction Temperature Using Surface Temperature

One way to determine if the measured junction temperatures for the exemplary large area emissive panel are reasonable is to compare the data with surface temperature measurements for the same panel. FIG. 6 shows the large area emissive panel layout for the exemplary experiment. The inventors energized the panel at a constant current density of 10 mA/cm$^2$ (corresponding to the target luminance) and allowed the panel to reach a constant voltage (i.e. the panel temperature was stable). The ambient temperature was approximately 20° C. A k-type thermocouple was then used to measure surface temperature at the 18 points shown in FIG. 13(a). The average surface temperature of points 1302 directly over the light emitting areas 1304 was calculated to be 30.3° C. (this is the average temperature of the 18 points). In comparison, the calculated junction temperature $T_j$ for the equivalent large area emissive panel at 10 mA/cm$^2$ was approximately 33° C. The surface temperature data measured by the inventors in this exemplary experiment is summarized in Table 3:

TABLE 3

Figure 13A:
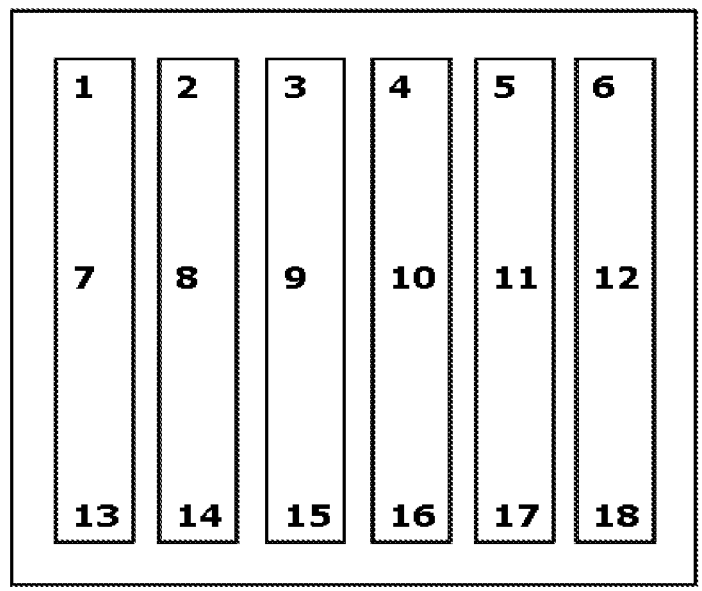
FIG. 13 shows a top-view and side view of an exemplary device.

| Point in FIG. 13(a) | Surface Temperature [° C.] |
| --- | --- |
| 1 | 29.0 |
| 2 | 30.1 |
| 3 | 30.5 |
| 4 | 30.7 |
| 5 | 29.6 |
| 6 | 29.1 |
| 7 | 30.5 |
| 8 | 32.6 |
| 9 | 33.5 |
| 10 | 33.4 |
| 11 | 32.7 |
| 12 | 30.6 |
| 13 | 27.8 |
| 14 | 29.2 |
| 15 | 29.7 |
| 16 | 29.5 |
| 17 | 29.0 |
| 18 | 27.7 |

Figure 13B:
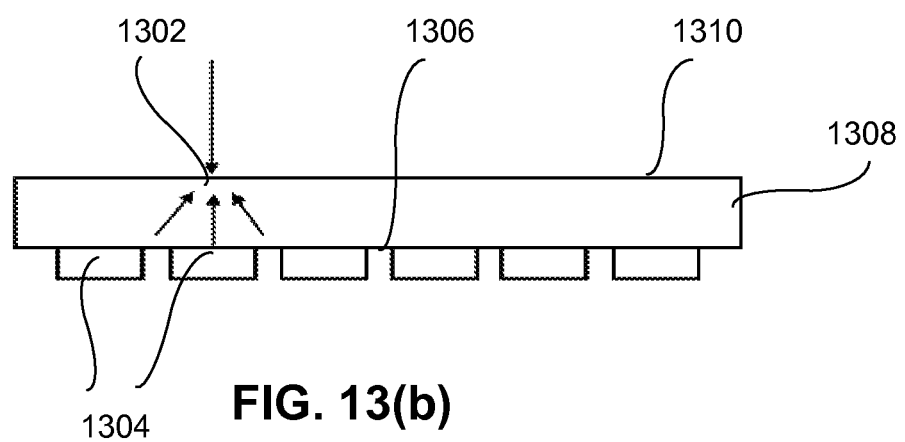

The discrepancy in the surface temperature and junction temperature measurements can be explained, in part, as follows. As shown in FIG. 13(b) (with further reference to FIG. 6), the six lighting stripes 1304 illustrated are separated by non-emitting stripes 1306 each of width 2.0 mm. The exemplary panel also had a glass substrate 1308 having a thickness of 0.7 mm positioned between the OLED stack and the measurement surface 1310. The surface temperature measurements are therefore the weighted average of the higher temperatures from the six OLED lighting stripes along with the lower temperatures from the non-emissive regions. Additionally, the glass substrate 1308 has a finite thermal resistance, which leads to a temperature drop across the thickness of the substrate 1308. It is therefore reasonable to expect that surface temperature will be lower than any predicted junction temperature. Table 3 also illustrates that a surface temperature gradient is expected across the OLED lighting panel.

Using Junction Temperature to Predict Lifetime of the Panel

In this exemplary experiment, the inventors then demonstrated that the junction temperature may be used to predict the lifetime of a large area organic emissive panel.

At the selected luminance for this experiment (current density of 10 mA/cm$^2$) the junction temperature ($T_a$) calculated above for the panel was approximately equal to 33° C. (or 306° Kelvin (K)). The inventors substituted the calculated junction temperature into the equation for the line of best fit from FIG. 9 (recall that FIG. 9 is a plot of the measured lifetimes (LT80) of equivalent individual organic emissive devices at varying temperature and at constant current density of 10 mA/cm$^2$), which is described by the equation: LT80 [hrs]=1.8259E+9*exp(−Temp [K]*0.049126). Performing this calculation for the calculated junction temperature (of approximately 32.7° C.) gives an expected lifetime (LT80) of approximately 541 hrs for the organic emissive panel. Thus, using the exemplary method described above, this is the lifetime predicted for the organic emissive panel at room temperature (approximate 20° C.) and at current density 10 mA/cm$^2$.

Figure 14:
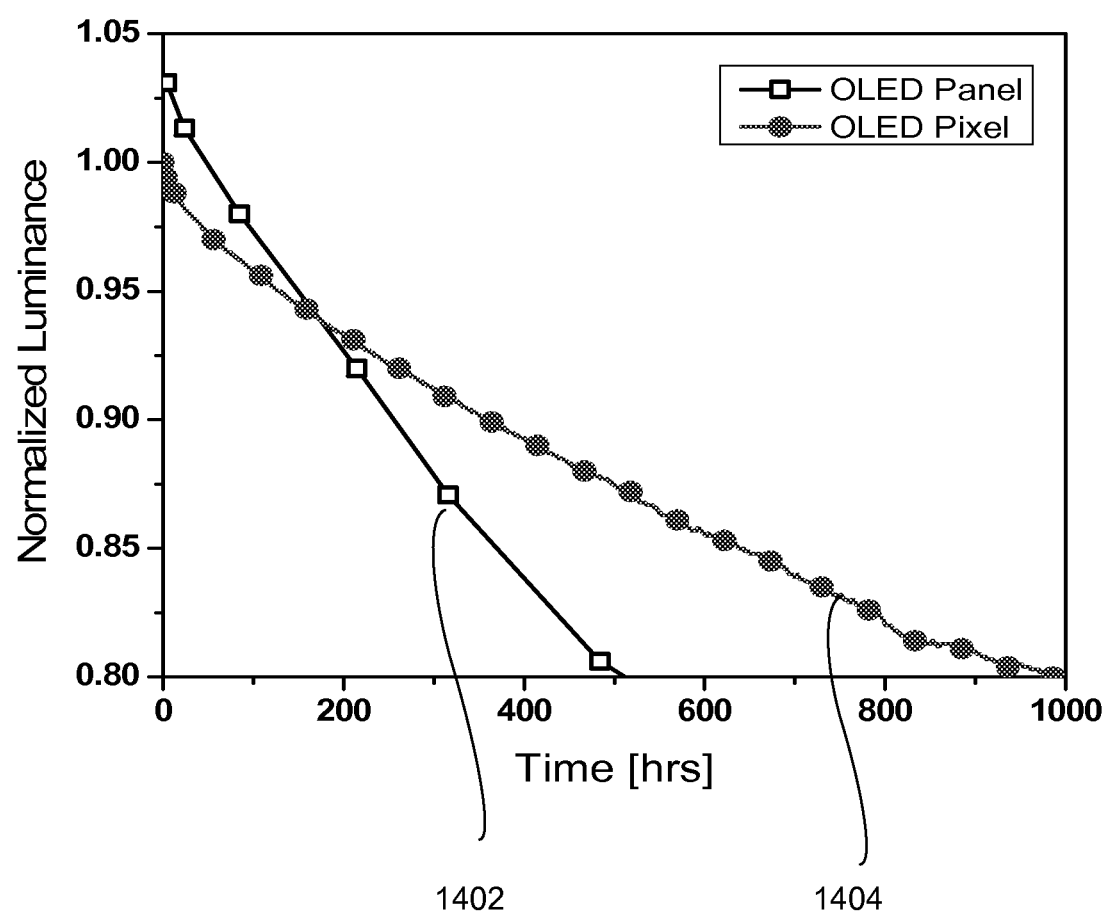
FIG. 14 shows a graph of luminance vs. time for exemplary devices.

To verify this prediction, the inventors put the organic emissive panel onto a lifetest at room temperature (20° C.) at a current density (J) of 10 mA/cm$^2$. FIG. 14 shows the normalized lifetest curve 1402 for the panel, along with the lifetest curve 1404 of an equivalent individual organic emissive device at the same current density (this is the data from FIG. 7, plot 706). For the individual organic emissive device, the initial luminance (Lo) was 3,780 cd/m$^2$, while for the organic emissive panel the initial luminance (Lo) was 3,800 cd/m$^2$. The inventors found that the panel luminance increases slightly upon initial illumination, which is shown in FIG. 14, where the normalized luminance for the panel is initially above 1.00. In this exemplary experiment, the luminance for the large area panel was calibrated for total light emission by measurement before and after lifetest inside a 20" integrating sphere. Thus, the plotted normalized luminance for the panel is based on total light emission across all viewing angles.

The results of the lifetest of the organic emissive panel, as show in FIG. 14, was that the lifetime (LT80) of the panel at 10 mA/cm$^2$ was found to be 512 hrs. In comparison, the lifetime (LT80) for the equivalent individual organic emissive devices was 988 hrs. Recall that the predicted lifetime using the junction temperature model in this exemplary experiment for the organic emissive panel lifetime (LT80) was calculated to be 541 hrs. Thus, while the actual lifetime and the projected lifetime are not identical, these values are extremely well matched (only approximately 5% difference), and any variation can readily be attributed to experimental factors such as plate-to-plate variations and small errors in any temperature or voltage measurements that may occur throughout the process. The validity of the proposed method was therefore demonstrated.

Predicting Lifetime at Higher and Lower Luminance Levels

The inventors have also found that the data collected in the experimental process described above can be used to predict panel lifetime at higher or lower luminance levels. Provided below are examples of ways to predict panel lifetime at 5 mA/cm$^2$. Other ways to correlate this information may also be used.

In the exemplary experiment, the data for the junction temperature of the large area panel has already been collected at 5 mA/cm$^2$ (see Table 2 above). Note also that the equivalent individual organic emissive device lifetime may be extrapolated from FIG. 8 for 5 mA/cm$^2$. Thus, the junction temperature and the individual organic emissive device lifetime are known for a current density of 5 mA/cm$^2$. However, to extrapolate panel lifetime, the gradient of linear fit of the lifetime (Log(LT)) versus the Temperature [in K] at 5 mA/cm$^2$ is needed. As an approximation, the gradient of linear fit of this plot is expected to be the same as what was determined for a current density (J) of 10 mA/cm$^2$ (which was done with reference to FIG. 9) because, as described above, localized heating is expected to be minimal for the individual organic emissive devices at low current density. Therefore, the results of FIG. 9 may then be used to estimate the factor by which lifetime is reduced from room temperature (20° C.) to junction temperature at 5 mA/cm$^2$. In other words, the reduction in device lifetime per degree increase in temperature should be the same at 5 mA/cm$^2$ as it was calculated for 10 mA/cm$^2$. This lifetime degradation factor can then be applied to the lifetime (LT80) extrapolated at 5 mA/cm$^2$ for the individual organic emissive devices in FIG. 8 at the junction temperature for the panel.

Thus, in this case, the calculated junction temperature was 25.2° C., which is approximately 5.2° C. greater than the ambient temperature of 20° C. (e.g. room temperature in this case). This increase in temperature can be used, along with the gradient of linear fit for the lifetime on logarithmic scale vs. temperature plot in FIG. 9, to adjust the extrapolated lifetime of the equivalent individual organic emissive devices at 5 mA/cm$^2$. This approach is preferred where minimal heating is expected for the individual organic emissive devices at the required current density because the gradient of linear fit if the temperature vs. lifetime curve should be relatively consistent.

In some embodiments, the lifetime of the panel may be determined by repeating the measurements of individual organic emissive device lifetime versus ambient temperature at a selected luminance. As noted above, it is typically possible to extrapolate lifetime to lower current densities (e.g. if the first lifetime determination was made at 10 mA/cm$^2$, it may be possible to extrapolate lifetime at 2 or 5 mA/cm$^2$). However, depending on the properties of a particular device, it may be difficult to predict lifetimes at much higher current densities. This process of repeating the individual organic emissive device measurements at a range of ambient temperatures at the required current density is preferred if localized heating is expected for the individual organic emissive devices at that current density, as the gradient of the lifetime versus temperature plot would then be expected to differ. This may be the case at high current density (J>10 mA/cm$^2$) where lifetime is expected to be relatively less dependent on the ambient temperature than at low current density.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

What is claimed is:

1. A method comprising:
    obtaining one or more individual organic emissive devices, each of the one or more organic devices having a first organic stack comprising one or more organic layers;
    measuring the lifetime of each of the one or more individual organic emissive devices at one or more temperatures at a non-heating current density;
    determining device lifetime for a selected luminance by using the measurements at the non-heating current density of the one or more devices;
    obtaining an organic emissive panel using a second organic stack that consists essentially of the one or more organic layers of the first organic stack;
    determining the junction temperature of the organic emissive panel at a heating current density; and
    determining the expected lifetime of the organic emissive panel at the heating current density by using the junction temperature of the organic emissive panel and the device lifetime of the one or more individual organic emissive device at the selected luminance;
    wherein measuring a lifetime of each of the one or more individual organic emissive devices is performed by an accelerated lifetime test; and
    wherein the accelerated lifetimes test comprises measuring the lifetime of a plurality of the individual organic emissive devices at a range of current densities.

2. The method of claim 1, further comprising operating the panel at the selected luminance.

3. The method of claim 1, wherein measuring the lifetime of each of the one or more individual organic emissive devices further comprises measuring the lifetime of a plurality of the individual organic emissive devices at a range of ambient temperatures.

4. The method of claim 3, further comprising:
    determining a relationship between device lifetime and ambient temperature for the selected luminance; and
    determining the expected lifetime of the organic emissive panel using the junction temperature and the relationship between device lifetime and ambient temperature of the plurality of individual organic emissive devices.

5. The method of claim 1, wherein the second organic stack is structurally equivalent to the first organic stack.

6. The method of claim 1, wherein the second organic stack is functionally equivalent to the first organic stack.

7. The method of claim 1, wherein the organic emissive panel comprises at least three different types of organic stacks, and the lifetime of at least one of the different stacks is measured using the method of claim 1.

8. The method of claim 1, wherein the organic emissive panel comprises a lighting panel.

9. The method of claim 1, wherein the organic emissive panel comprises a display panel.

10. The method of claim 1, wherein the step of determining the junction temperature of the organic emissive panel further comprises:
    determining a relationship K between applied voltage and ambient temperature for the panel at a first non-heating current density;
    measuring a first voltage $V_j$ across the organic stack at a first temperature $T_{rt}$ of the panel at a second non-heating current density;

energizing the panel to approximately the selected luminance such that a second temperature higher than the first temperature is reached;

measuring a second voltage $V_4$ across the organic stack at a second temperature of the panel at the second non-heating current density;

determining the junction temperature $T_j$ of the panel as:

$$T_j = T_{rt} + K(V_1 - V_4).$$

11. The method of claim 1, wherein the step of determining the junction temperature of the organic emissive panel further comprises measuring a surface temperature of the organic emissive panel at the selected luminance.

12. A method comprising:

obtaining one or more individual organic emissive devices, each of the one or more organic devices having a first organic stack comprising one or more organic layers;

measuring the lifetime of each of the one or more individual organic emissive devices at one or more temperatures at a non-heating current density;

determining device lifetime for a selected luminance by using the measurements at the non-heating current density of the one or more devices;

obtaining an organic emissive panel using a second organic stack that consists essentially of the one or more organic layers of the first organic stack;

determining the junction temperature of the organic emissive panel at a heating current density; and determining the expected lifetime of the organic emissive panel at the heating current density by using the junction temperature of the organic emissive panel and the device lifetime of the one or more individual organic emissive device at the selected luminance; and wherein measuring the lifetime of each of the one or more individual organic emissive devices further comprises measuring the lifetime of each of the one or more individual organic emissive devices at the junction temperature of the organic emissive panel at the heating current density.

13. The method of claim 12, wherein determining the device lifetime at the selected luminance is performed by an accelerated lifetime test.

14. The method of claim 13, wherein the accelerated lifetime test comprises measuring the lifetime of a plurality of the individual organic emissive devices at a range of current densities.

15. The method of claim 12, wherein determining the lifetime of the organic emissive device comprises measuring the lifetime of at least one of the individual organic emissive devices at the junction temperature and the selected luminance.

16. A method comprising:

obtaining one or more individual organic emissive devices, each of the one or more organic devices having a first organic stack comprising one or more organic layers;

measuring the lifetime of each of the one or more individual organic emissive devices at one or more temperatures at a non-heating current density;

determining device lifetime for a selected luminance by using the measurements at the non-heating current density of the one or more devices;

obtaining an organic emissive panel using a second organic stack that consists essentially of the one or more organic layers of the first organic stack;

determining the junction temperature of the organic emissive panel at a heating current density; and determining the expected lifetime of the organic emissive panel at the heating current density by using the junction temperature of the organic emissive panel and the device lifetime of the one or more individual organic emissive device at the selected luminance;

wherein the step of determining the junction temperature of the organic emissive panel further comprises:

determining a relationship K between applied voltage and ambient temperature for the panel at a first non-heating current density;

measuring a first voltage $V_1$ across the organic stack at a first temperature $T_{rt}$ of the panel at a second non-heating current density;

energizing the panel to approximately the selected luminance such that a second temperature higher than the first temperature is reached;

measuring a second voltage $V_4$ across the organic stack at a second temperature of the panel at the second non-heating current density;

determining the junction temperature $T_j$ of the panel as:

$$T_j = T_{rt} + K(V_1 - V_4)$$

wherein the step of determining the relationship K further comprises:

measuring voltage across the organic stack in the organic emissive panel as a function of ambient temperature at the first non-heating current density; and calculating K as the gradient of an approximate linear fit of the measured voltage versus ambient temperature.

17. A method comprising:

obtaining one or more individual organic emissive devices, each of the one or more organic devices having a first organic stack comprising one or more organic layers;

measuring the lifetime of each of the one or more individual organic emissive devices at one or more temperatures at a non-heating current density;

determining device lifetime for a selected luminance by using the measurements at the non-heating current density of the one or more devices;

obtaining an organic emissive panel using a second organic stack that consists essentially of the one or more organic layers of the first organic stack;

determining the junction temperature of the organic emissive panel at a heating current density; and determining the expected lifetime of the organic emissive panel at the heating current density by using the junction temperature of the organic emissive panel and the device lifetime of the one or more individual organic emissive device at the selected luminance; and wherein the step of determining the junction temperature of the organic emissive panel further comprises:

determining a relationship K between applied voltage and ambient temperature for the panel at a pulse applied current density, wherein the pulse applied current density has:

a pulse width; a separation between pulses;

a duty cycle;

an average current density, wherein the average current density is a non-heating current density; and a peak current density;

measuring a first voltage $V_2$ across the organic stack at a first temperature $T_{rt}$ of the panel at a first heating current density;

measuring a second voltage $V_3$ across the organic stack at a second temperature of the panel at the first heating current density;

determining the junction temperature $T_j$ of the panel as:

$T_j = T_{rt} + K(V_1 - V_4)$.

18. The method of claim 17, wherein the step of determining the relationship K further comprises:
measuring voltage across the organic stack in the organic emissive panel as a function of ambient temperature at the pulse applied current density; and
calculating K as the gradient of an approximate linear fit of the measured voltage versus ambient temperature.

* * * * *